(12) United States Patent
Laven et al.

(10) Patent No.: US 9,997,602 B2
(45) Date of Patent: Jun. 12, 2018

(54) SEMICONDUCTOR DEVICE WITH TRANSISTOR CELLS AND ENHANCEMENT CELLS WITH DELAYED CONTROL SIGNALS

(71) Applicant: Infineon Technologies AG, Neubiberg (DE)

(72) Inventors: Johannes Georg Laven, Taufkirchen (DE); Roman Baburske, Otterfing (DE); Matteo Dainese, Villach (AT); Christian Jaeger, Munich (DE)

(73) Assignee: Infineon Technologies AG, Neubiberg (DE)

( * ) Notice: Subject to any disclaimer, the term of this patent is extended or adjusted under 35 U.S.C. 154(b) by 103 days.

(21) Appl. No.: 14/975,761

(22) Filed: Dec. 19, 2015

(65) Prior Publication Data

US 2016/0190123 A1    Jun. 30, 2016

(30) Foreign Application Priority Data

Dec. 23, 2014   (DE) .................. 10 2014 119 543

(51) Int. Cl.
*H01L 29/40* (2006.01)
*H01L 29/739* (2006.01)
(Continued)

(52) U.S. Cl.
CPC ........ *H01L 29/407* (2013.01); *H01L 29/0834* (2013.01); *H01L 29/1095* (2013.01);
(Continued)

(58) Field of Classification Search
CPC ............ H01L 29/407; H01L 29/42368; H01L 29/42376; H01L 29/7397; H01L 29/8613
See application file for complete search history.

(56) References Cited

U.S. PATENT DOCUMENTS 5,608,238 A *   3/1997   Matsuda ............. H01L 29/1095
                                                257/133
5,751,024 A     5/1998   Takahashi
(Continued)

FOREIGN PATENT DOCUMENTS

JP      H10163469 A    6/1998
JP      2010109545 A   5/2010
(Continued)

*Primary Examiner* — Matthew Landau
*Assistant Examiner* — Mark Hatzilambrou
(74) *Attorney, Agent, or Firm* — Murphy, Bilak & Homiller, PLLC

(57) ABSTRACT

A semiconductor device includes transistor cells and enhancement cells. Each transistor cell includes a body zone that forms a first pn junction with a drift structure. The transistor cells may form, in the body zones, inversion channels when a first control signal exceeds a first threshold. The inversion channels form part of a connection between the drift structure and a first load electrode. A delay unit generates a second control signal which trailing edge is delayed with respect to a trailing edge of the first control signal. The enhancement cells form inversion layers in the drift structure when the second control signal falls below a second threshold lower than the first threshold. The inversion layers are effective as minority charge carrier emitters.

22 Claims, 33 Drawing Sheets

(51) Int. Cl.
  *H01L 29/10* (2006.01)
  *H01L 29/423* (2006.01)
  *H01L 29/08* (2006.01)
  *H01L 29/861* (2006.01)
  *H01L 27/082* (2006.01)
  *H01L 27/088* (2006.01)
  *H01L 29/06* (2006.01)
  *H01L 29/36* (2006.01)

(52) U.S. Cl.
  CPC .. *H01L 29/42368* (2013.01); *H01L 29/42376* (2013.01); *H01L 29/7397* (2013.01); *H01L 29/8613* (2013.01); *H01L 27/0825* (2013.01); *H01L 27/0883* (2013.01); *H01L 29/0619* (2013.01); *H01L 29/36* (2013.01)

(56) References Cited

U.S. PATENT DOCUMENTS

| | | |
|---|---|---|
| 7,423,316 B2 | 9/2008 | Kawaji et al. |
| 7,986,003 B2 | 7/2011 | Aono et al. |
| 8,299,539 B2 | 10/2012 | Kouno |
| 2002/0179976 A1 | 12/2002 | Takahashi |
| 2014/0209972 A1* | 7/2014 | Sumitomo .......... H01L 29/4232 257/140 |
| 2015/0014743 A1 | 1/2015 | Werber et al. |

FOREIGN PATENT DOCUMENTS

| | | |
|---|---|---|
| JP | 2012151470 A | 8/2012 |
| JP | 2013098415 A | 5/2013 |
| JP | 2013251395 A | 12/2013 |

* cited by examiner

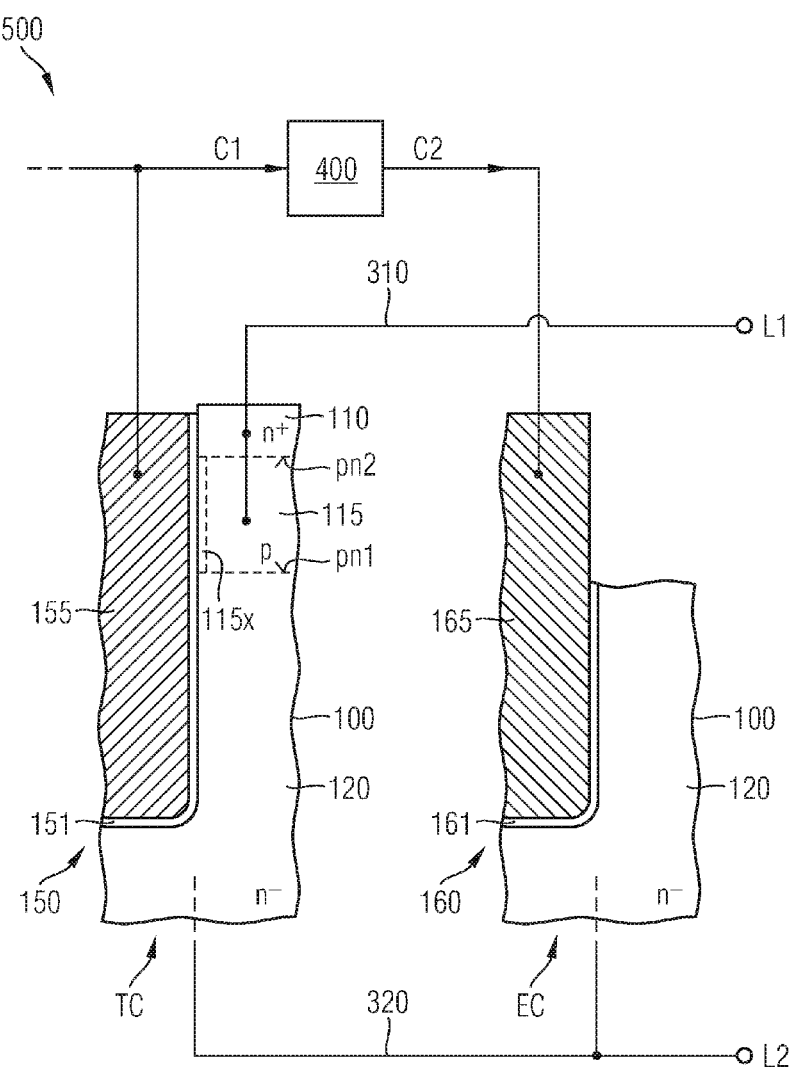

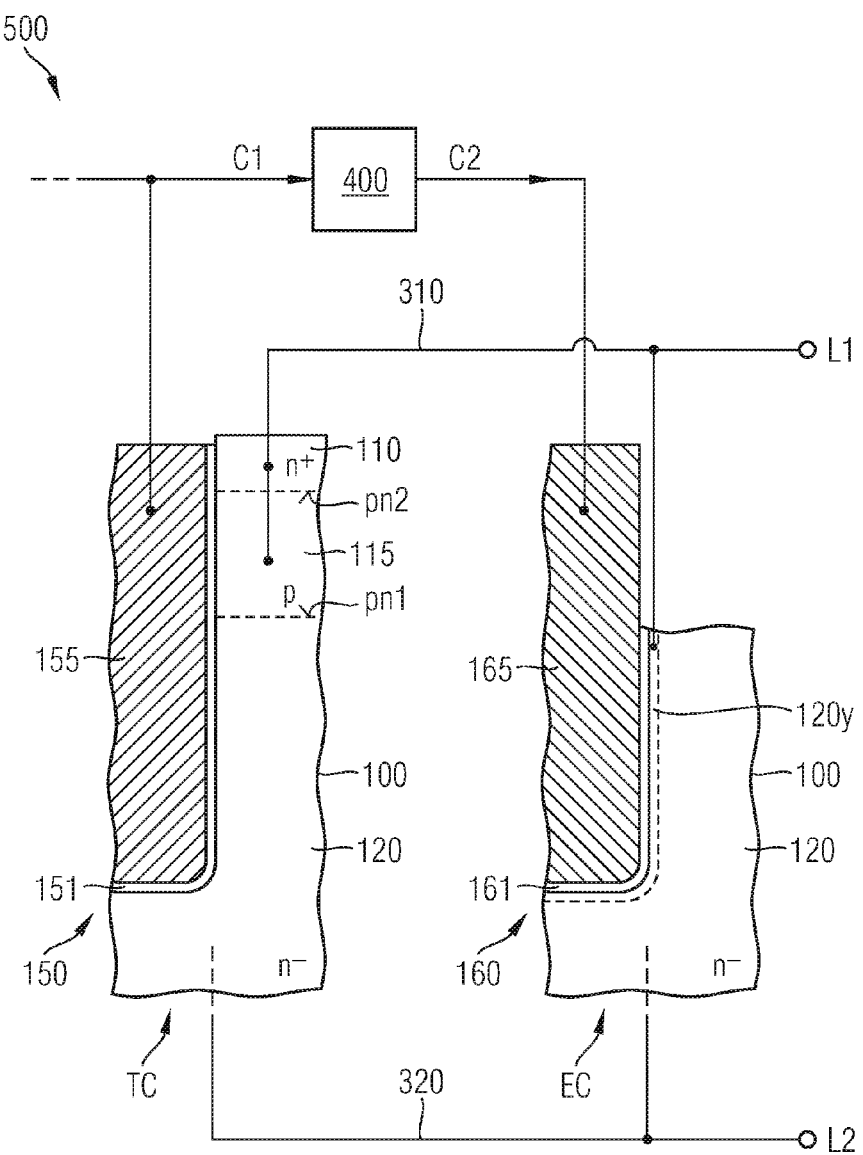

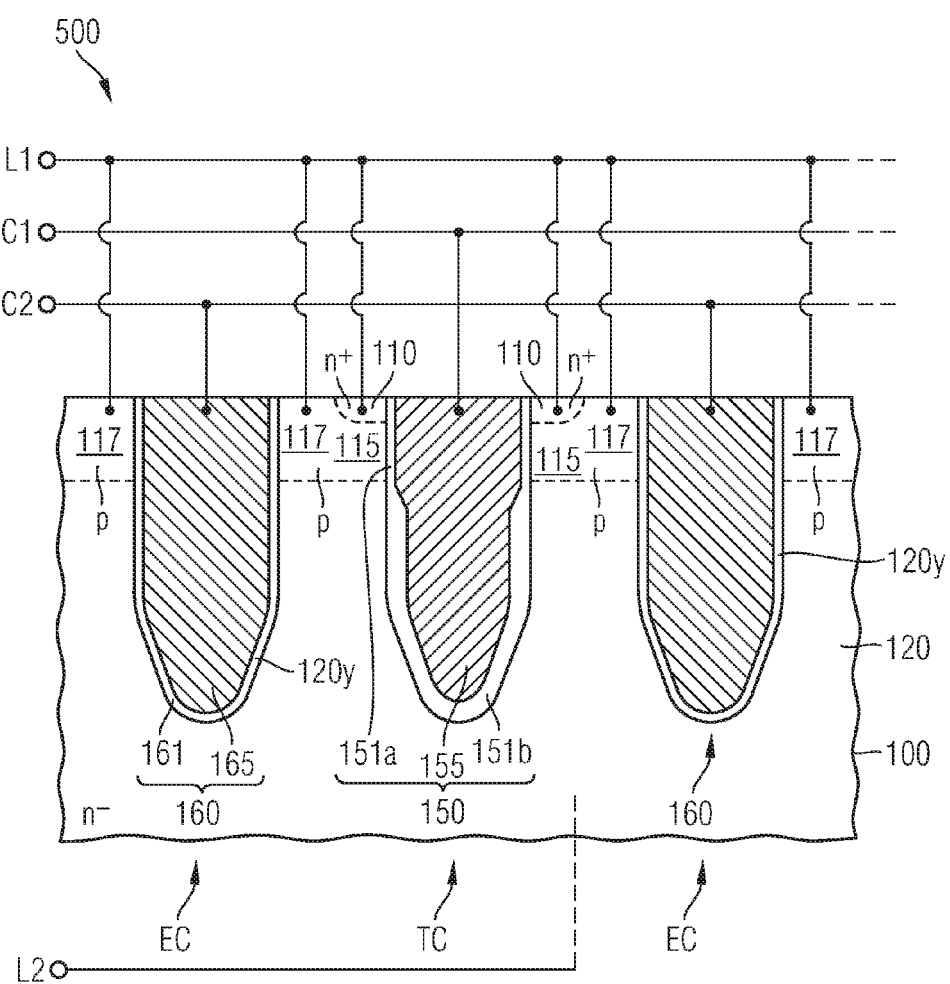

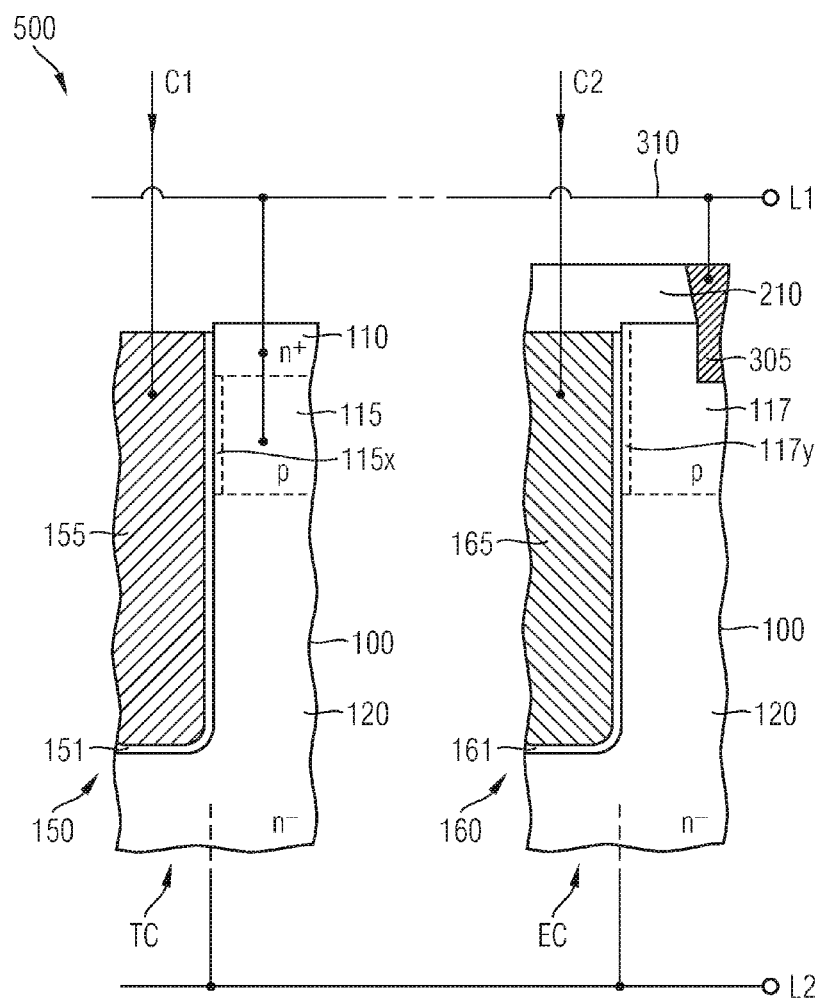

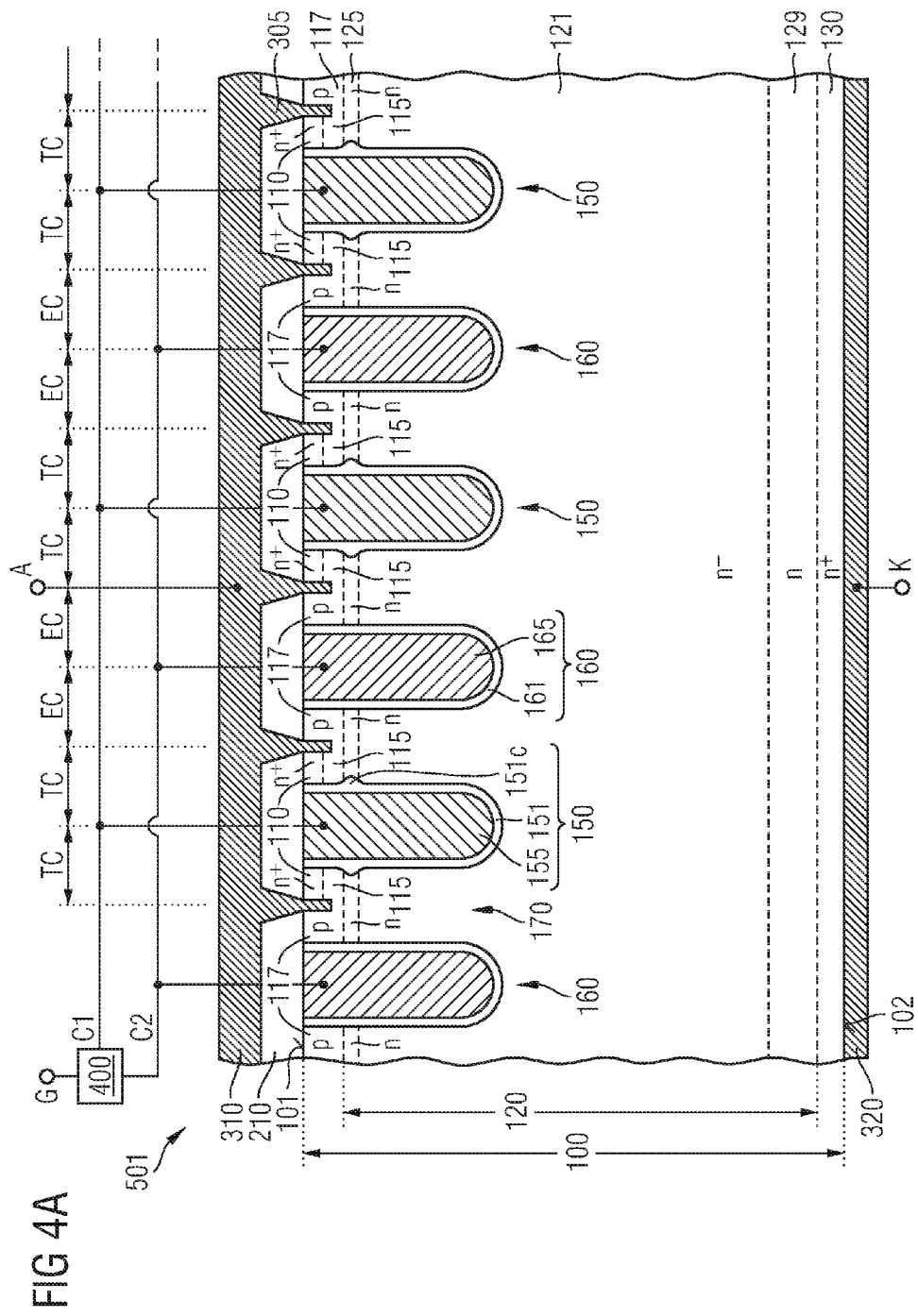

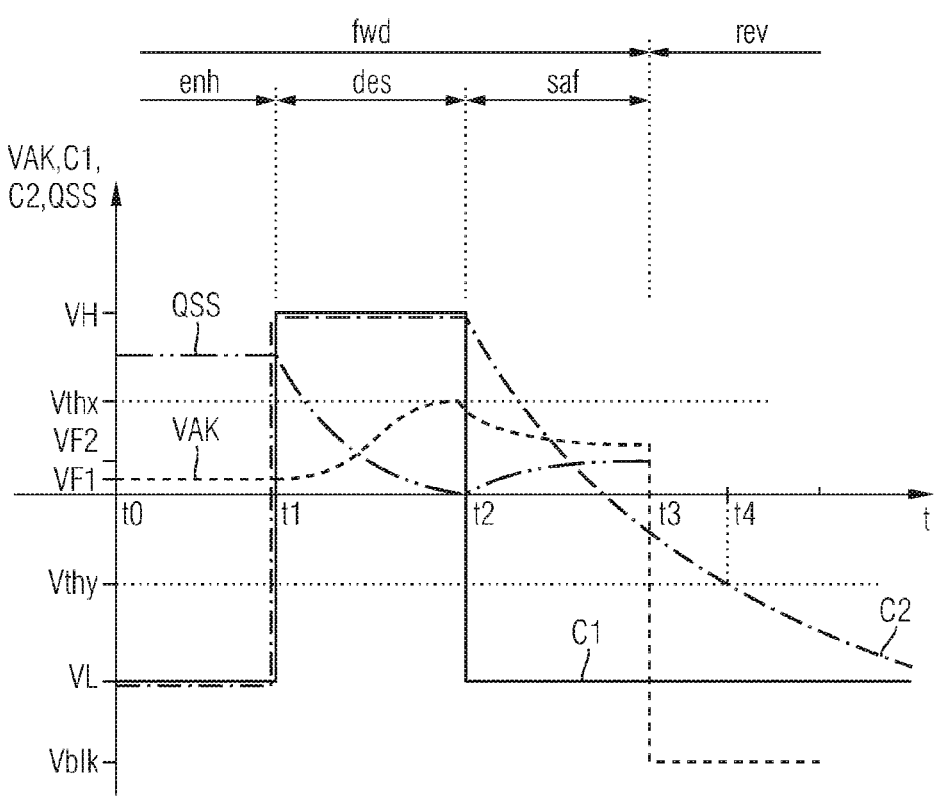

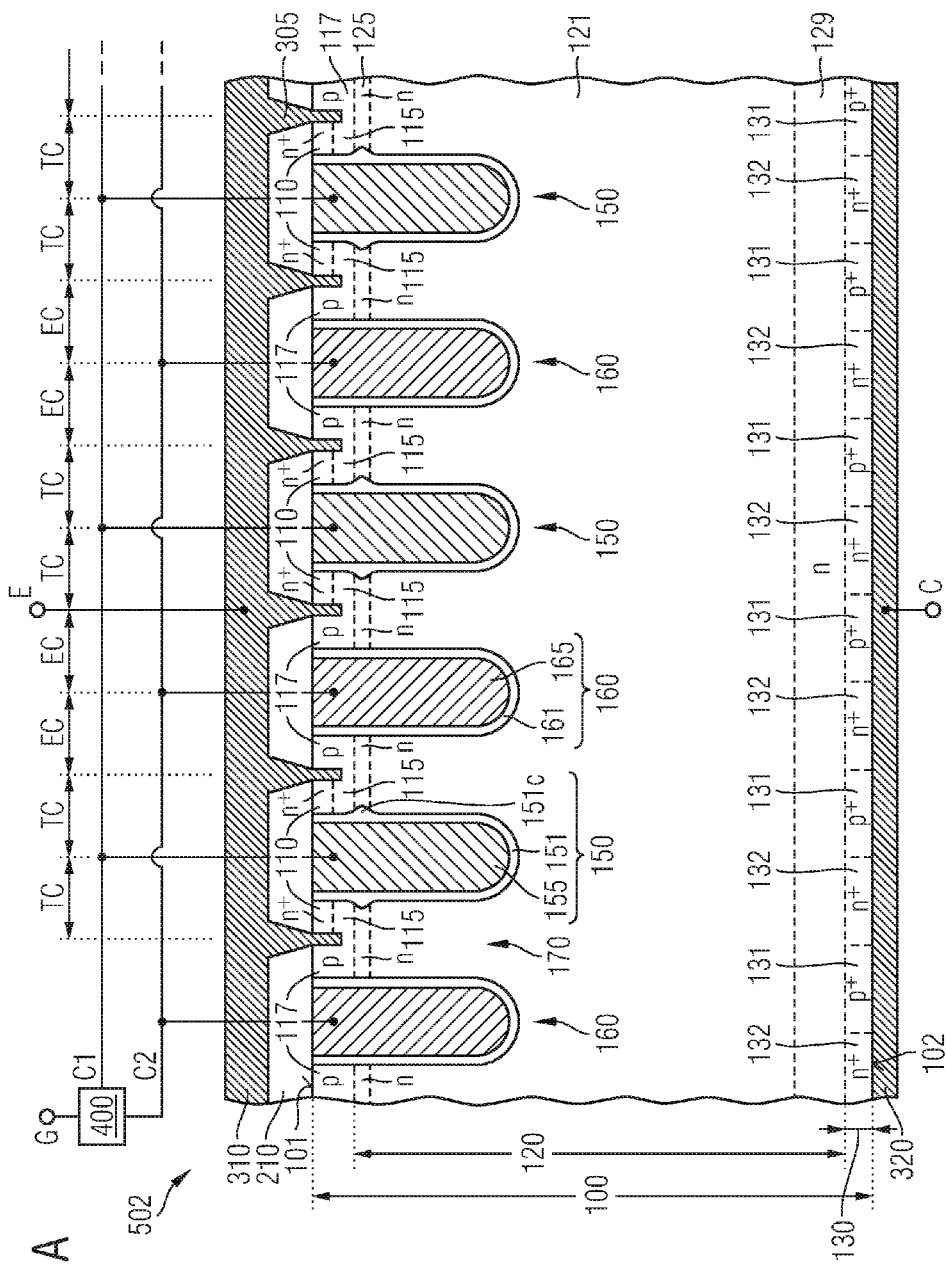

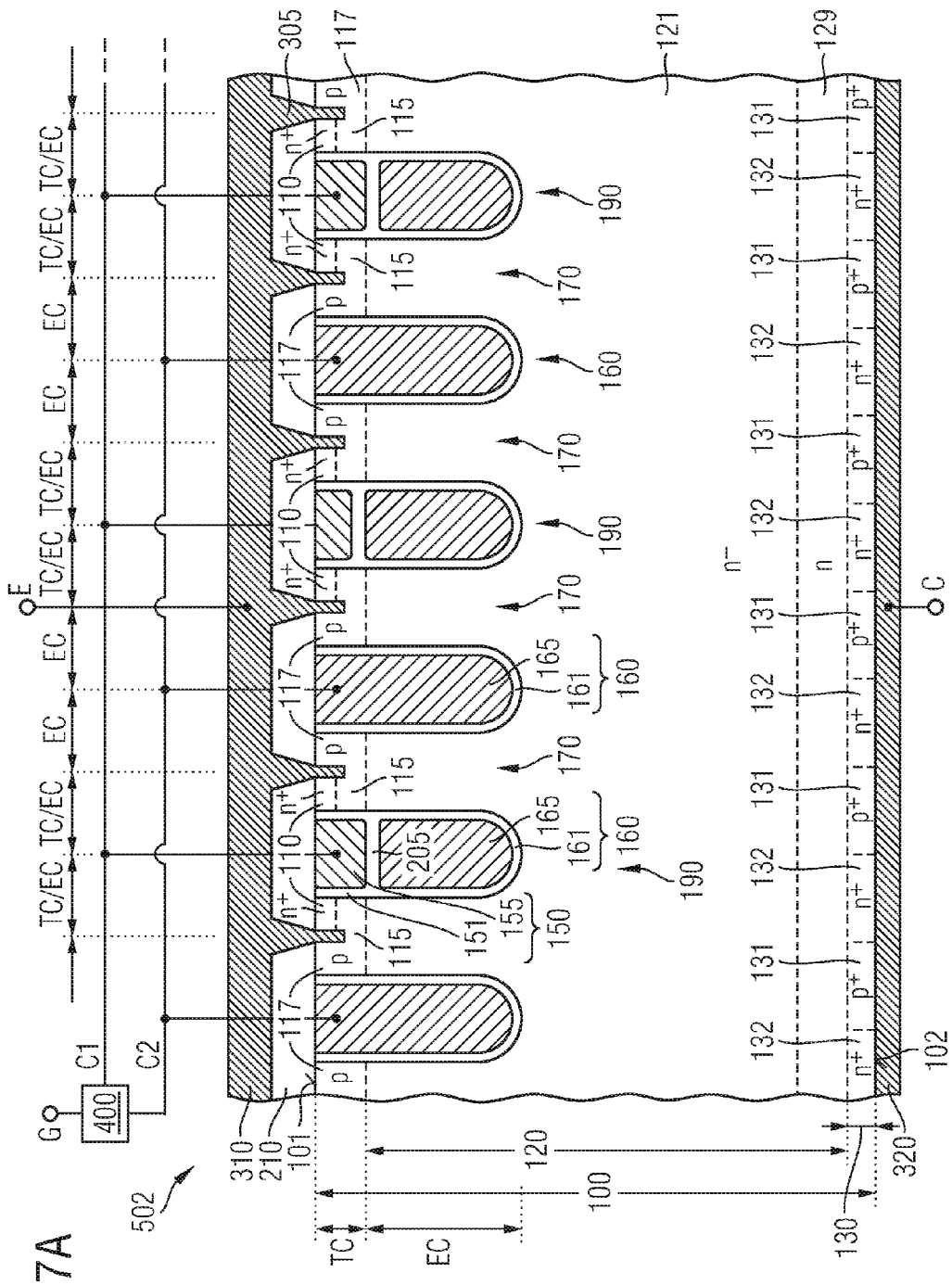

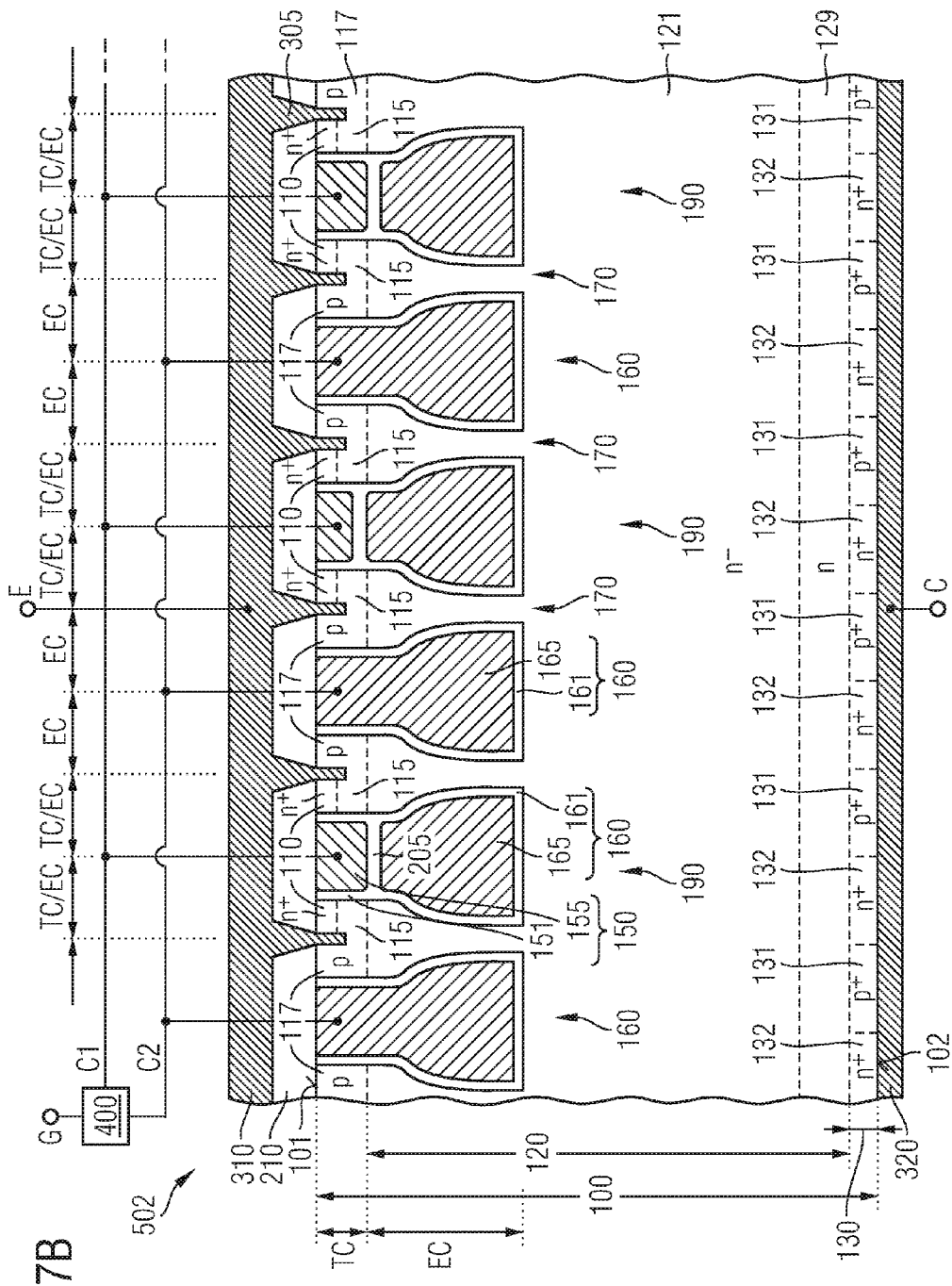

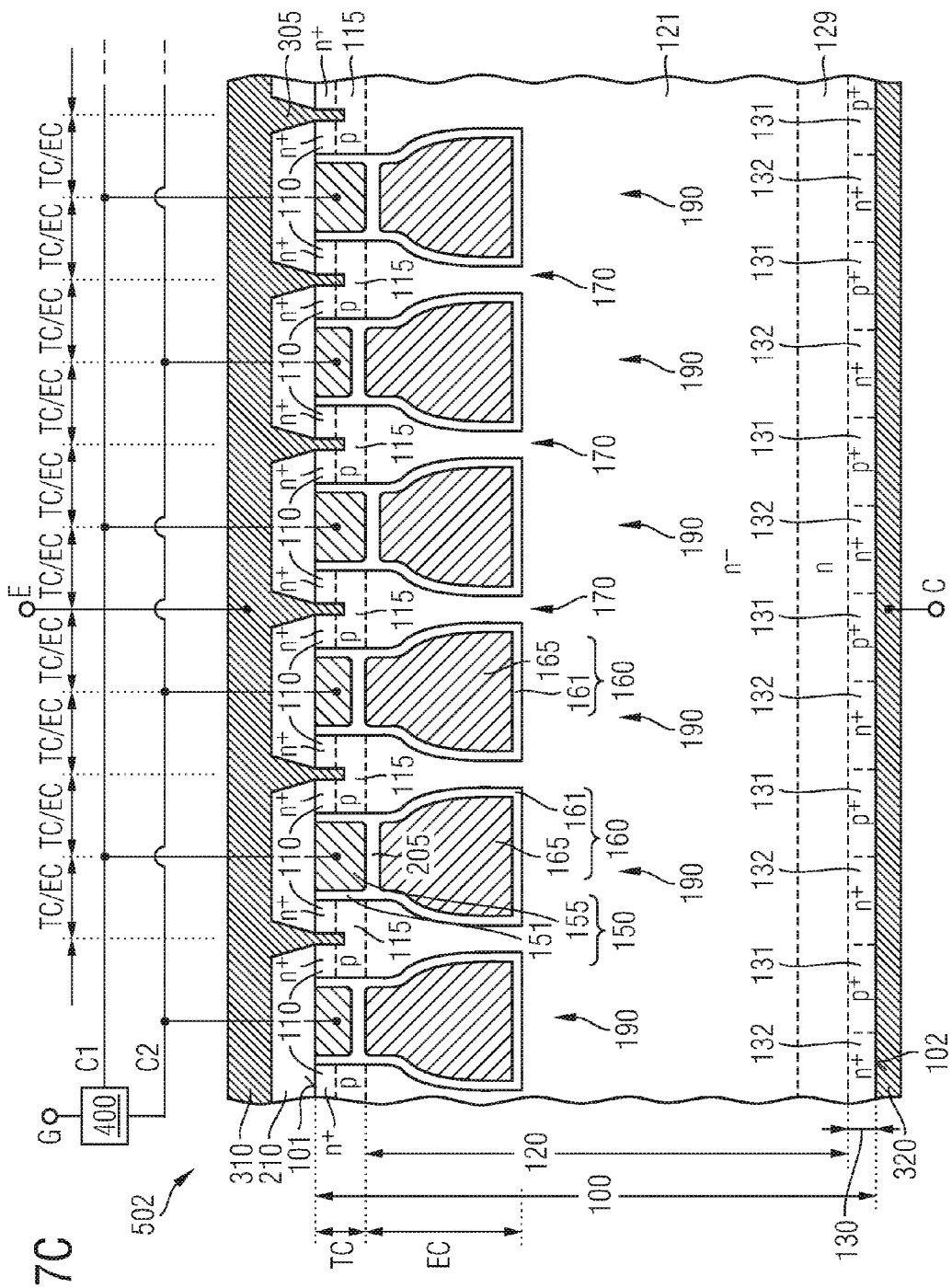

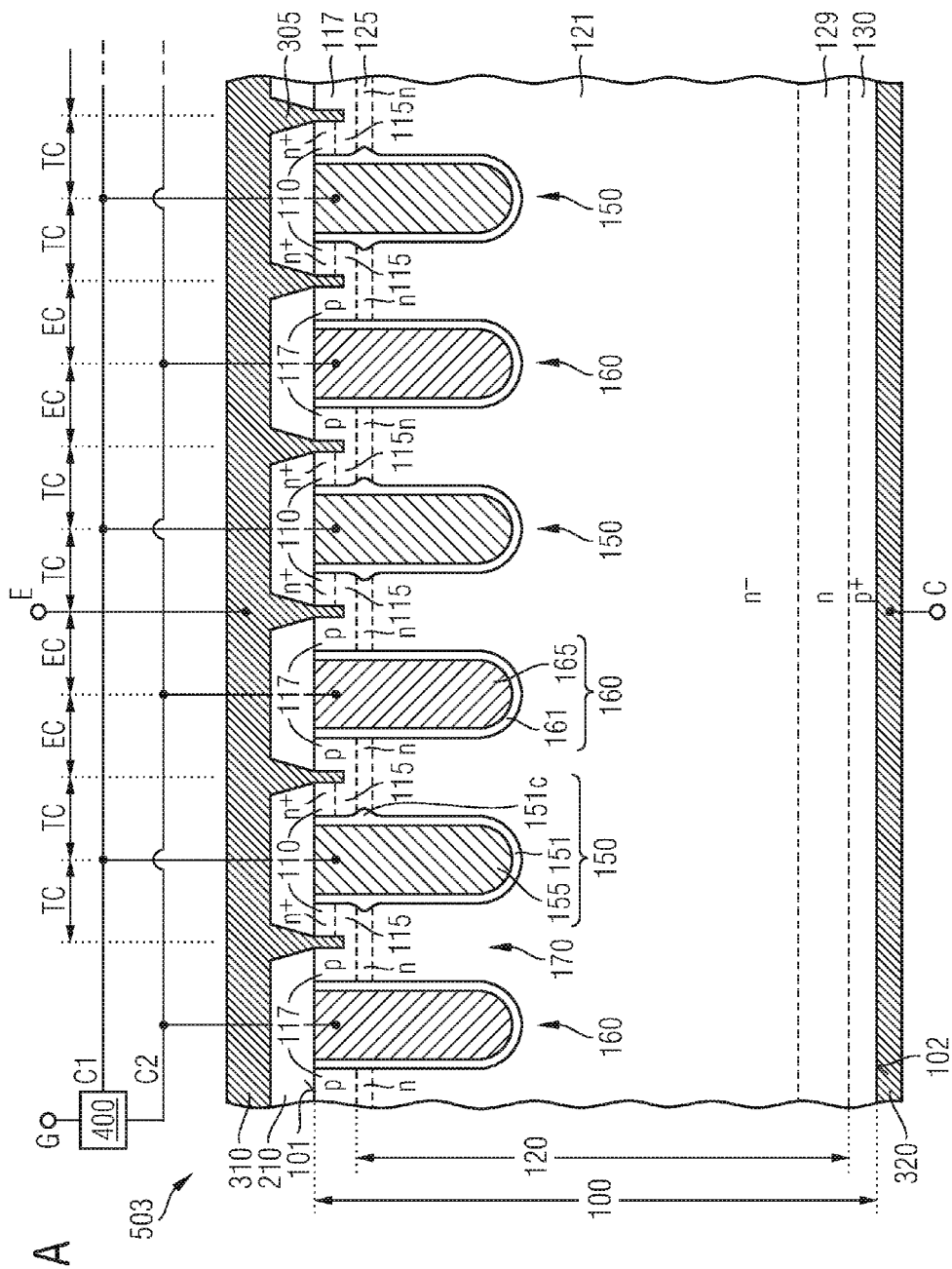

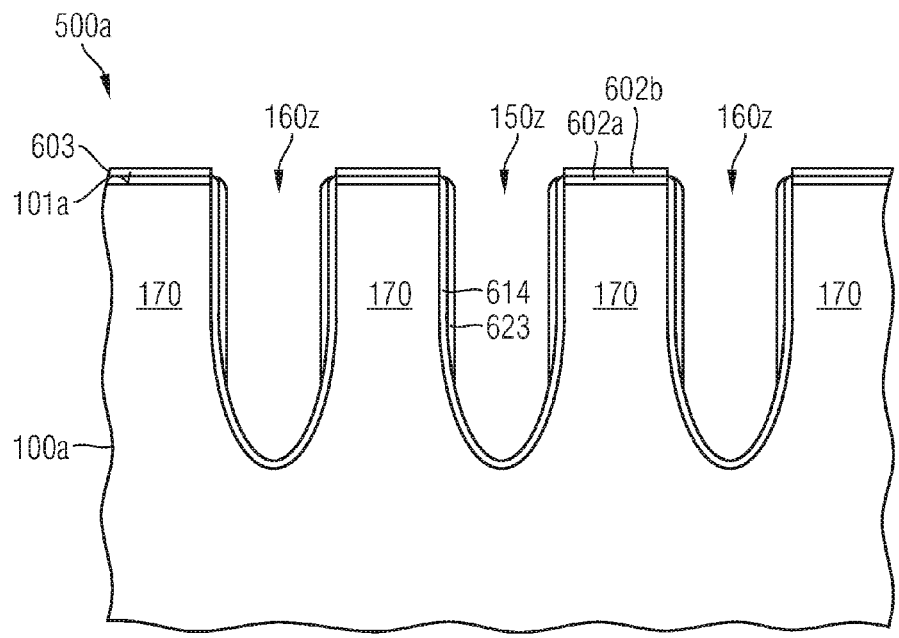
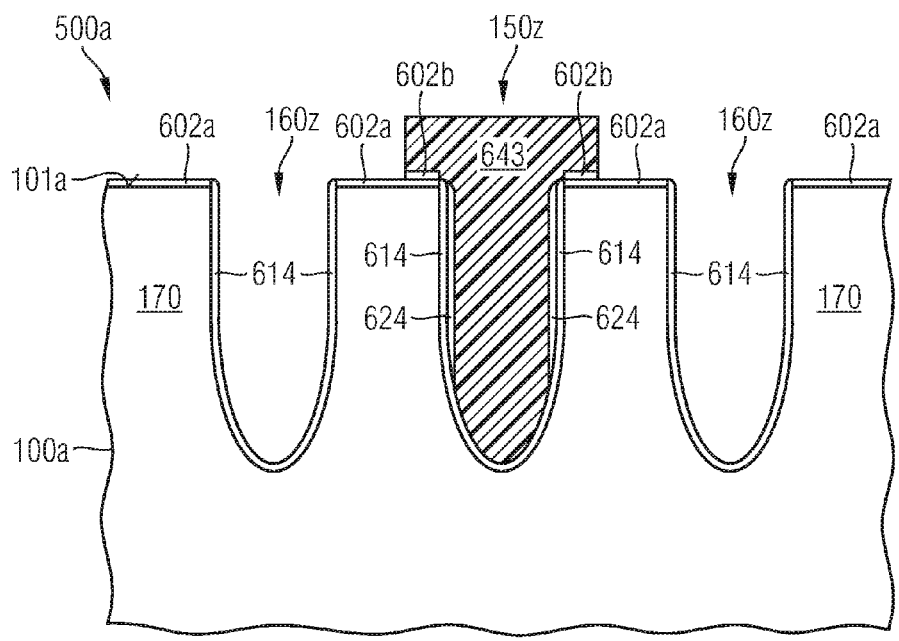

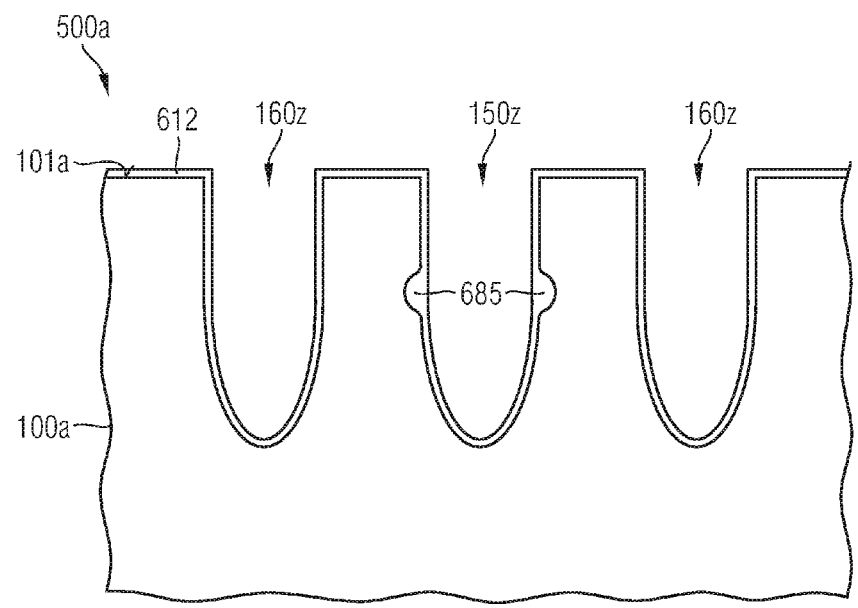
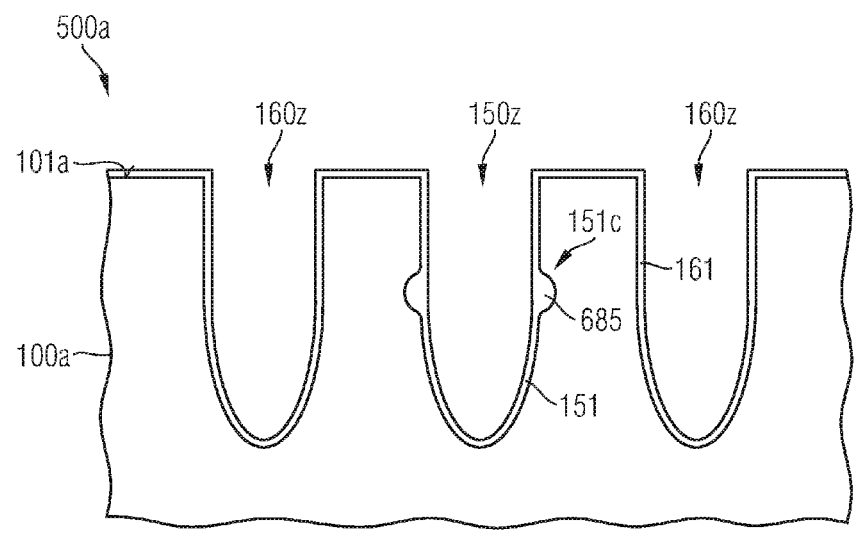

SEMICONDUCTOR DEVICE WITH TRANSISTOR CELLS AND ENHANCEMENT CELLS WITH DELAYED CONTROL SIGNALS

PRIORITY CLAIM

This application claims priority to German Patent Application No. 10 2014 119 543.4 filed on 23 Dec. 2014, the content of said application incorporated herein by reference in its entirety.

BACKGROUND

In semiconductor devices that include both transistor cells and a diode functionality such as RC-IGBTs (reverse conducting insulated gate bipolar transistors), mobile charge carriers flood a lightly doped semiconductor region along a forward biased pn junction and form a dense charge carrier plasma that results in a low forward resistance of the diode. When the forward bias at the pn junction changes to a reverse bias, a reverse recovery current relieves the charge carrier plasma thereby contributing to dynamic switching losses of the semiconductor device. During a desaturation period preceding the change from forward biased to reverse biased, a gated MOS (metal oxide semiconductor) channel may attenuate the charge carrier plasma in order to reduce the reverse recovery current and dynamic switching losses. A safety period between the end of the desaturation period and the change to reverse biased secures that the semiconductor device timely restores a blocking capability with closed MOS channel before commutation starts. During the safety period the charge carrier plasma may partially recover such that the safety period foils to some degree the effect of the desaturation period.

It is desirable to improve the switching characteristics of semiconductor devices that include both MOS gated channels and diode functionality.

SUMMARY

According to an embodiment a semiconductor device includes a transistor cell including a body zone that forms a first pn junction with a drift structure. When a first control signal exceeds a first threshold, the transistor cell forms an inversion channel in the body zone, wherein the inversion channel forms part of a connection between the drift structure and a first load electrode. A delay unit generates a second control signal which trailing edge is delayed with respect to a trailing edge of the first control signal. When the second control signal falls below a second threshold which is lower than the first threshold, an enhancement cell forms an inversion layer in the drift structure. The inversion layer is effective as minority charge carrier emitter.

According to another embodiment, a power module includes a half-bridge circuit with two switching elements. At least one of the switching elements includes a semiconductor device with a transistor cell including a body zone that forms a first pn junction with a drift structure. When a first control signal exceeds a first threshold, the transistor cell forms an inversion channel in the body zone, wherein the inversion channel forms part of a connection between the drift structure and a first load electrode. A delay unit generates a second control signal which trailing edge is delayed with respect to a trailing edge of the first control signal. When the second control signal falls below a second threshold which is lower than the first threshold, an enhancement cell forms an inversion layer in the drift structure. The inversion layer is effective as minority charge carrier emitter.

According to a further embodiment, a semiconductor device includes an enhancement cell that forms an inversion layer in a drift structure, when a second control signal falls below a second threshold. The inversion layer is effective as minority charge carrier conductor. A delay unit generates a first control signal which trailing edge is delayed with respect to a trailing edge of the second control signal. A transistor cell includes a body zone that forms a first pn junction with the drift structure. When the first control signal exceeds a first threshold higher than the second threshold the transistor cell forms an inversion channel in the body zone. The inversion channel is part of a connection between the drift structure and a first load electrode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A shows schematic cross-sectional views of portions of a semiconductor device with transistor cells and enhancement cells according to an embodiment, in a first state.

FIG. 1B shows schematic cross-sectional views of the portions of the semiconductor device of FIG. 1A in a second state.

FIG. 2B is a schematic cross-sectional view of a portion of a semiconductor device according to an embodiment concerning transistor cells with reinforced gate dielectric portions.

FIG. 3A includes cross-sectional views of portions of a semiconductor device according to an embodiment related to enhancement cells without source zones.

FIG. 4A is a schematic cross-sectional view of a portion of a semiconductor device with transistor and enhancement cells according to an embodiment concerning a semiconductor diode.

FIG. 4B is a schematic time chart for illustrating a desaturation cycle for the semiconductor diode of FIG. 4A.

FIG. 5A is a schematic cross-sectional view of a portion of a semiconductor device including enhancement and transistor cells according to an embodiment concerning an RC-IGBT.

FIG. 7A is a schematic cross-sectional view of a portion of an RC-IGBT according to an embodiment related to enhancement cells formed in a vertical projection of transistor cells.

FIG. 7B is a schematic cross-sectional view of a portion of an RC-IGBT according to an embodiment related to mesa sections with narrowed portions.

FIG. 7C is a schematic cross-sectional view of a portion of an RC-IGBT according to a further embodiment related to mesa sections with narrowed portions.

FIG. 9A is a schematic cross-sectional view of a portion of a non-reverse conducting IGBT according to a further embodiment.

FIG. 12C is a schematic cross-sectional view of the semiconductor substrate portion of FIG. 12B, after patterning the spacer mask layer to form a spacer mask.

FIG. 12D is a schematic cross-sectional view of the semiconductor substrate portion of FIG. 12C, after removing portions of the spacer mask in second trenches.

FIG. 14C is a schematic cross-sectional view of the semiconductor substrate portion of FIG. 14B, after forming a sacrificial oxide layer.

FIG. 14D is a schematic cross-sectional view of the semiconductor substrate portion of FIG. 14C, after forming first and second gate dielectrics.

DETAILED DESCRIPTION

Figure 1C:
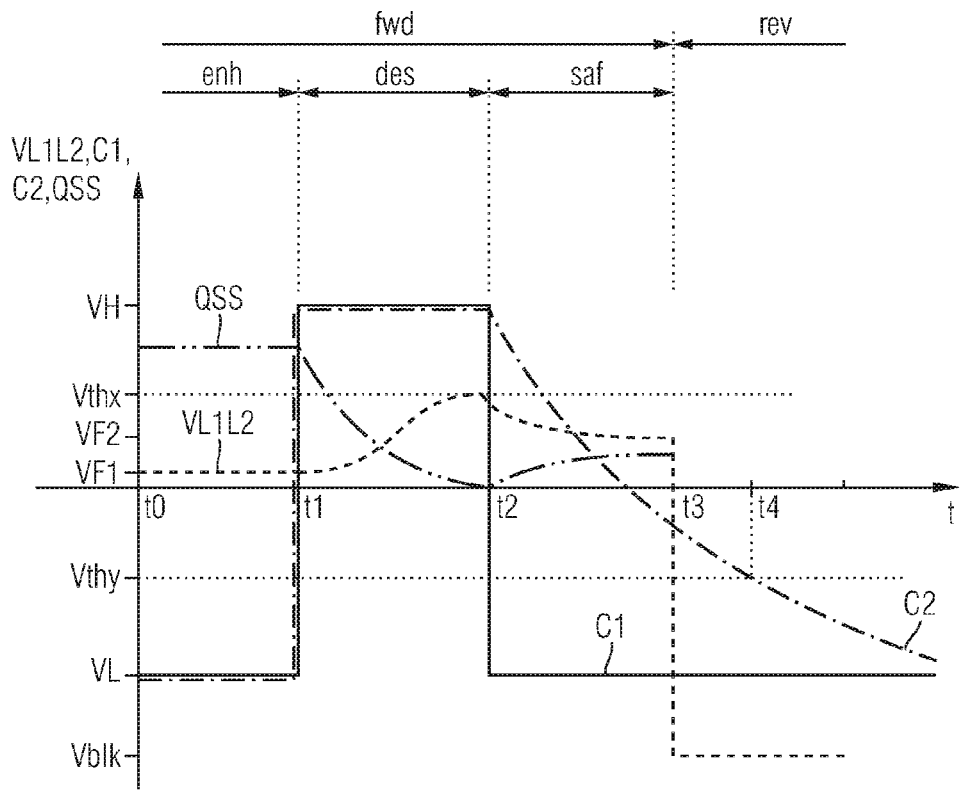
FIG. 1C is a schematic time chart for illustrating a desaturation cycle of the semiconductor device of FIGS. 1A and 1B.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "$n^-$" means a doping concentration which is lower than the doping concentration of an "n"-doping region while an "$n^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a portion of a semiconductor device 500, which may be, for example, an MGD (MOS gated diode), an RC-IGBT or a device including further electronic circuits in addition to an MGD or RC-IGBT functionality.

The semiconductor device 500 includes transistor cells TC and enhancement cells EC which semiconducting portions are formed in a semiconductor body 100. The semiconductor body 100 is formed from crystalline semiconductor material, such as single crystalline silicon (Si), silicon carbide (SiC), germanium (Ge), silicon germanium (SiGe), gallium nitride (GaN), gallium arsenide (GaAs) or any other $A_{III}B_V$ semiconductor.

The transistor cells TC are FET (field effect transistor) cells and include a first gate structure 150 with a conductive first gate electrode 155 and a first gate dielectric 151 separating the first gate electrode 155 from the semiconductor body 100. Each transistor cell TC further includes a body zone 115 and a source zone 110, wherein the body zone 115 forms a first pn junction pn1 with a drift structure 120 and a second pn junction pn2 with the source zone 110. The body zones 115 and the source zones 110 are electrically connected to a first load electrode 310 which may form or which may be electrically connected or coupled to a first load terminal L1. The drift structure 120 is electrically connected or coupled to a second load electrode 320 which may form or which may be electrically connected or coupled to a second load terminal L2.

The enhancement cells EC are also FET cells, wherein each enhancement cell EC includes a second gate structure 160 with a second gate electrode 165 and a second gate dielectric 161 electrically separating the second gate electrode 165 from the semiconductor body 100. The second gate structure 160 directly adjoins the drift structure 120.

The first and second gate structures 150, 160 may be planar gate structures formed outside a contour of the semiconductor body 100. According to the illustrated embodiment, the first and second gate structures 150, 160 are trench structures extending from a front side into the semiconductor body 100.

The first and second gate structures 150, 160 may have different, similar or identical dimensions. According to an embodiment, an interface area between a second gate structure 160 and the drift structure 120 may be significantly greater, e.g., at least twice as large, as an interface area between a first gate structure 150 and the drift structure 120.

The first and second gate electrodes 155, 165 may be homogeneous structures from a conductive material, such as polycrystalline silicon or may have a layered structure including one or more metal containing layer(s). According to an embodiment the first and second gate electrodes 155, 165 may be provided from the same material(s).

The first and second gate dielectrics 151, 161 may be homogeneous structures from one dielectric material, such as a semiconductor oxide, or may have a layered structure including two or more layers of dielectric materials. The dielectric materials may include thermally grown semiconductor oxide, for example thermally grown silicon oxide, deposited semiconductor oxide, for example deposited silicon oxide, silicon nitride or silicon oxynitride, by way of example. According to an embodiment the first and second gate dielectrics 151, 161 may be provided from the same material(s).

The body zones 115 are doped regions with a second conductivity type opposite to a first conductivity type of the drift structure 120 and the source zones 110. The body zones 115 separate the source zones 110 from the drift structure 120.

In addition to the transistor cells TC and enhancement cells EC, the semiconductor device 500 may include further cells, for example cells which are controlled in a way that differs from the control of the transistor cells TC and the enhancement cells EC, or idle cells that do neither contribute to a load current nor to a desaturation of the semiconductor device 500.

The following description refers to embodiments with n-channel FET cells, wherein the first conductivity type is n-type and the second conductivity type is p-type. Equivalent considerations apply to embodiments based on p-channel FET cells, wherein the first conductivity type is p-type and the second conductivity type is n-type.

FIG. 1A concerns control of the transistor cells TC by a first control signal C1 that varies a potential at the first gate electrodes 155. When the first control signal C1 exceeds a first threshold, the transistor cells TC form inversion channels 115x along the first gate structures 150. The inversion channels 115x extend through the body zones 115 from the drift structure 120 to the respective source zone 110, wherein the drift structure 120 gets connected to the first load electrode 310 through a unipolar charge carrier flow. The inversion channels 315x are turned off when the first control signal C1 falls below the first threshold.

FIG. 1B concerns control of the enhancement cells EC by a second control signal C2 that varies a potential at the second gate electrodes 165. When the second control signal C2 falls below a second threshold lower than the first threshold, the enhancement cells EC form inversion layers 120y along the second gate structures 160 in the drift structure 120.

The inversion layers 120y are electrically connected to the first load electrode 310 through doped regions of the conductivity type of the body zones 115. The doped regions may be the body zones 115 of the transistor cells TC or additional charge carrier transfer zones as described in detail below. The inversion layers 120y contribute to a total charge carrier emitter efficiency of the body zones 115 in a bipolar conduction mode of the first pn junctions pn1. The inversion layers 120y are turned off, when the second control signal C2 exceeds the second threshold.

The first control signal C1 may approximately be a square signal which leading and trailing edges are steep compared to a minimum switching period of the first control signal C1. A delay unit 400 may derive the second control signal C2 from the first control signal C1 or may derive both the first and second control signals C1, C2 from a gate signal, wherein the delay unit 400 delays trailing edges of the second control signal C2 with respect to corresponding trailing edges of the first control signal C1.

The time diagram of FIG. 1C illustrates a desaturation cycle of the semiconductor device 500 of FIGS. 1A and 1B with a diode functionality based on the first pn junctions pn1.

At t=t0 the first pn junctions pn1 are forward biased with a positive voltage VL1L2 between the first and second load terminals L1, L2. A low level VL of the first control signal C1 below a second threshold voltage Vthy turns off the transistor cells TC. A low level VL of the second control signal C2 below the second threshold voltage Vthy turns on the inversion layers 120y in the enhancement cells EC. The semiconductor device 500 is in an enhanced bipolar conduction mode with both types of charge carriers contributing to a charge carrier plasma in the drift structure 120 and with the inversion layers 120y increasing hole emitter efficiency and charge carrier plasma density. In the enhanced bipolar conduction mode, a forward voltage VF1 across the diode is low, whereas a storage charge Qss in the semiconductor body 100 is high.

At t=t1 the first control signal C1 changes to a high level VH above the first threshold voltage Vthx at which inversion channels 115x form in the body zones 115 of the transistor cells TC. The inversion channels 115x bypass the first pn junctions pn1 in the transistor cells TC and inhibit injection of charge carriers into the drift structures 120. Instead, the inversion channels 115x facilitate a unipolar charge carrier flow between the drift structure 120 and the first load terminal L1.

A desaturation period starts, during which the charge carrier plasma density in the drift structure 120 as well as the storage charge Qss significantly decrease. At first the inversion channels 115x may further decrease the voltage VL1L2 between the first and second load terminals L1, L2 to some degree. Then the reduced charge carrier plasma density reduces the conductivity in the drift structure 120 to a degree that that VL1L2 increases to a value above the forward voltage VF1.

The second control signal C2 may immediately follow the first control signal C1 such that the enhancement cells EC turn off the inversion layers 120y in the drift structure 120. Insofar the enhancement cells EC form secondary inversion layers through doped zones of the conductivity type of the body zones 115, such secondary inversion layers remain without connection to the first load terminal L1 and have no or only low impact on a blocking capability of the semiconductor device 500.

At t=t2 the first control signal C1 steeply falls back to the low level VL below the second threshold voltage Vthy. The desaturation period ends with the inversion channels 115x of the transistor cells TC being turned off. With the first pn junctions pn1 no longer bypassed, a safety period starts in which the semiconductor device 500 regains its full blocking capability. The body zones 115 may resume injecting charge carriers into the drift structure 120 and charge carrier plasma density may increase again.

Since the delay unit 400 delays the trailing edge of the second control signal C2 with respect to the trailing edge of the first control signal C1, the second control signal C2 does not immediately fall below the second threshold Vthy such that the enhancement cells EC do not immediately form the inversion layers 120y in the drift structure 120. Therefore charge carrier emitter efficiency as well as storage charge Qss remain low for a certain period of time starting at t=t2.

At t=t3 the forward bias changes to reverse bias and a negative blocking voltage Vblk is applied between the first and second load electrodes L1, L2. Since the inversion channels 115x are turned off, the semiconductor device 500 can immediately sustain the full blocking voltage Vblk. If the second control signal C2 falls slow enough such that the second control signal C2 does not fall below the second threshold voltage Vthy within the safety period between t2 and t3, the storage charge Qss still is low when the semiconductor device 500 commutates. Reverse recovery current and switching losses are lower than in devices with the transistor and enhancement cells synchronously controlled.

The semiconductor device 500 combines safe turn off of the transistor cells TC before commutation, low charge carrier emitter efficiency during a safety period between the end of the desaturation period and the start of commutation, as well as high charge carrier emitter efficiency in an enhanced bipolar conduction mode of the concerned diode. In other words, the desaturation cycle including desaturation period and safety period combines a promptly re-established forward blocking capability with high desaturation efficiency.

The second threshold voltage may be a negative voltage such that during the safety period a negative voltage level can be applied to the first gate electrodes 155. As a consequence, compared to devices with a desaturation voltage of 0V, the semiconductor device 500 is more robust against parasitic turn-on events. Other than three-level approaches, the semiconductor device 500 gets along without an additional desaturation level such that more common two-level gate drivers can be used instead of rather uncommon three-level gate drivers.

At t=t4 the second control signal C2 falls below the second threshold voltage Vthy. When the voltage VL1L2 between the first and second load electrodes L1, L2 changes back to forward biased only after t=t4, the semiconductor device 500 can immediately change into the enhanced bipolar conduction mode with low forward voltage VF1.

During the safety period, the delayed trailing edge of the second control signal C2 effects that the enhancement cells EC do not form inversion layers 120y in the drift structure 120. On the other hand, the non-delayed trailing edge of the first control signal C1 may effect that the transistor cells TC form further inversion layers in the drift structure 120. The further inversion layers may locally increase the hole emitter efficiency and to some degree may foil the effect of the desaturation period between t1 and t2. The effect may be negligible if a total area ratio of transistor cells TC to enhancement cells EC is low.

Enhancement and transistor cells EC, TC may be evenly or unevenly distributed. According to embodiments referring to semiconductor diodes or RC-IGBTs, a population density of enhancement cells EC may decrease with decreasing distance to an edge of a transistor cell array that includes the transistor and enhancement cells TC, EC. For reverse blocking IGBTs, the population density of enhancement cells may increase with decreasing distance to an edge of the transistor cell array.

Figure 1D:
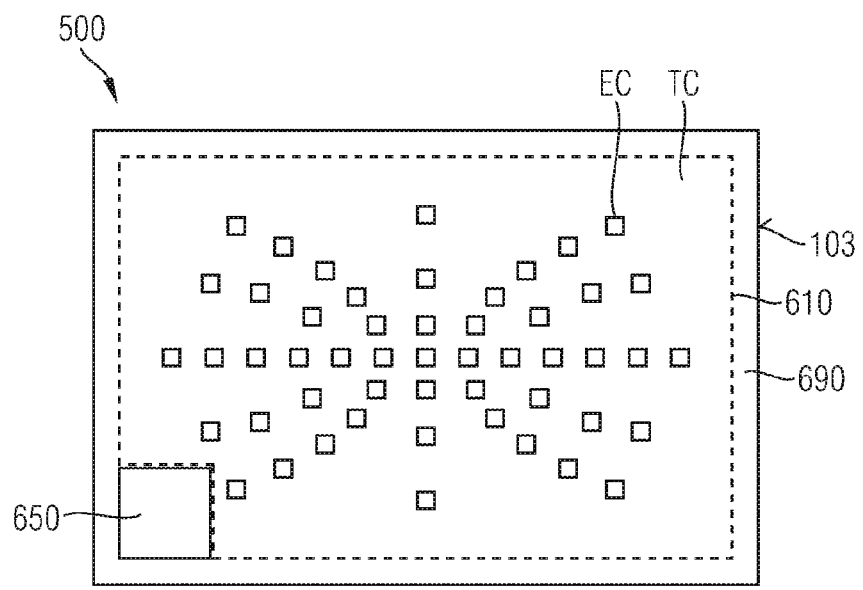
FIG. 1D is a schematic plan view of a semiconductor device according to an embodiment with uneven distribution of transistor and enhancement cells.

FIG. 1D shows a semiconductor device 500 with a transistor cell array 610 including enhancement cells EC and, outside the enhancement cells EC, transistor cells TC. An edge area 690 without transistor and enhancement cells TC, EC surrounds the transistor cell array 610 and separates the transistor cell array 610 from a side surface 103 of the semiconductor body 100 defining a chip edge. The transistor cell array 610 may further adjoin idle regions 650 assigned to, for example, gate connections, e.g., gate pads, gate runners, gate rings or gate fingers.

With decreasing distance to the edge area 690 and the idle regions 650, a population density of the enhancement cells EC may gradually or in steps decrease to reduce a flooding of the idle and edge regions 650, 690 with charge carriers in case of forward biased pn junctions, e.g., a forward biased semiconductor diode or a reverse biased RC-IGBT.

FIGS. 2A to 2E refer to transistor cells TC with low charge carrier emitter efficiency during the safety period and to enhancement cells EC including charge carrier transfer zones 117 of the conductivity type of the body zones 115. The charge carrier transfer zones 117 form further first pn junctions pn1 with the drift structure 120 and electrically connect the inversion layers 120y in the drift structure 120 with the first load electrode 310. The charge carrier transfer zones 117 may directly adjoin the body zones 115 of the transistor cells TC or may be formed separated from the body zones 115.

The first and second gate structures 150, 160 extend from a first surface 101 into the semiconductor body 100 that includes the semiconducting portions of the transistor cells TC and the enhancement cells EC. A normal to the first surface 101 defines a vertical direction. Directions parallel to the first surface 101 are horizontal directions.

The transistor cells TC may be formed such that no or only short further inversion layers 120x are formed in the drift structure 120 along the first gate structures 150 or such that the further inversion layers 120x in the drift structure 120 are formed without connection to the first load electrode 310. The description of the following embodiments embraces and continues the description of the embodiments of FIGS. 1A to 1B.

Figure 2A:
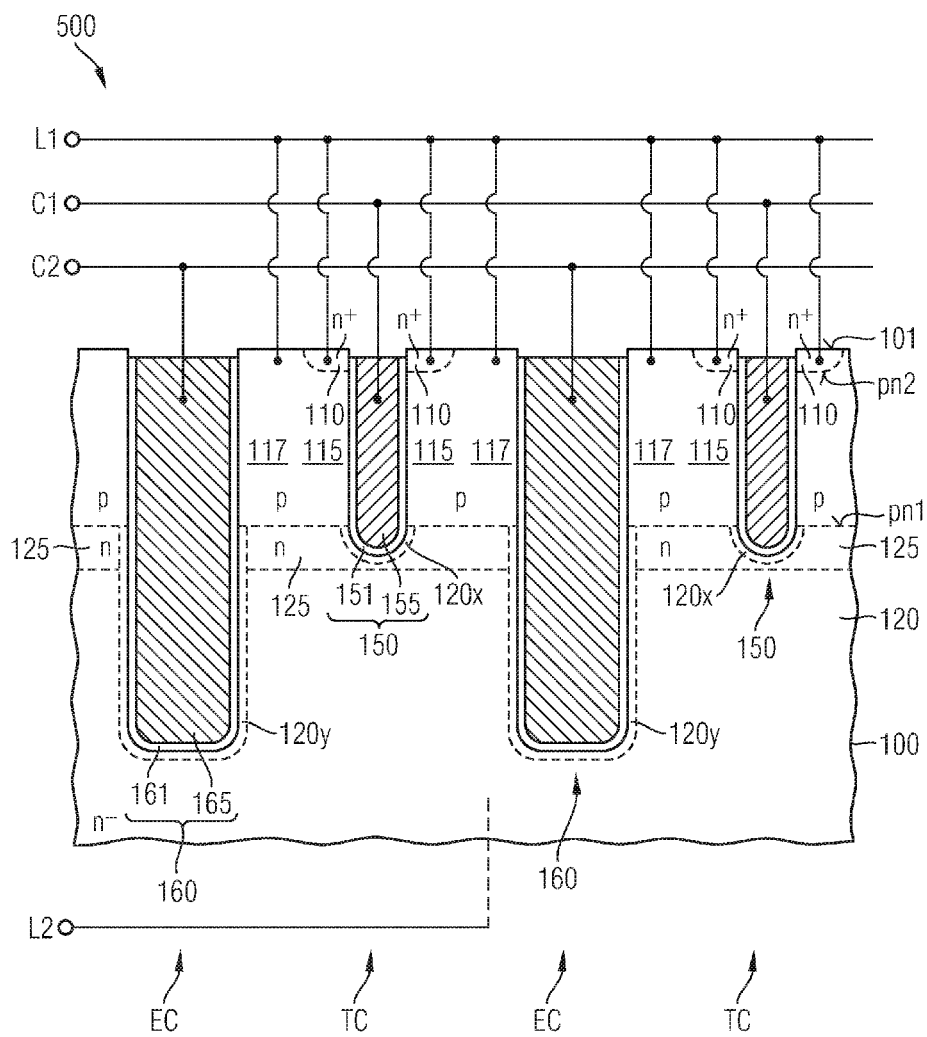
FIG. 2A is a schematic cross-sectional view of a portion of a semiconductor device with transistor and enhancement cells according to an embodiment concerning different vertical extensions of gate structures of transistor and enhancement cells.

In FIG. 2A the first gate structures 150 of the transistor cells TC overlap to a lower degree with the drift structure 120 than the second gate structures 160 of the enhancement cells EC. An interface area between a first gate structure 150 and the drift structure 120 is at most half of an interface area between a second gate structure 160 and the drift structure 120. Inversion layers 120x formed in the drift structure 120 along the first gate structures 150 are significantly shorter or narrower than the inversion layers 120y formed in the drift structure 120 along the second gate structures 160. According to the illustrated embodiment, a vertical extension of the first gate structures 150 is smaller than a vertical extension of the second gate structures 160.

According to an embodiment the first and the second gate structures 150, 160 are formed in two different, successive trench etches, wherein the total trench etch time for the second gate structures 160 is longer than for the first gate structures 150. If the drift structure 120 includes more heavily doped barrier zones 125 adjoining the body zones 115, the second gate structures 160 may extend through the barrier zones 125, whereas the first gate structures 150 may end within the barrier zones 125. According to another embodiment, different vertical extensions of the first and second gate structures 150, 160 are achieved in one single trench etch process with the second gate structures 160 formed wider than the first gate structures 150.

FIG. 2B refers to transistor cells TC which first gate dielectrics 151 include first sections 151a separating the first gate electrodes 150 from the body zones 115 and second sections 151b separating the first gate electrodes 155 from the drift structure 120. The second sections 151b are formed such that formation of a further inversion layer 120x in the drift structure 120 is suppressed at the low level of the first control signal C1. For example, the second sections 151b may be formed from another material than the first sections 151a. According to an embodiment, the first and second sections 151a, 151b may be formed from the same material(s), e.g., thermally grown semiconductor oxide, and a thickness of the second sections 151b exceeds a thickness of the first sections 151a by at least 50%, e.g., by at least 100%.

Figure 2C:
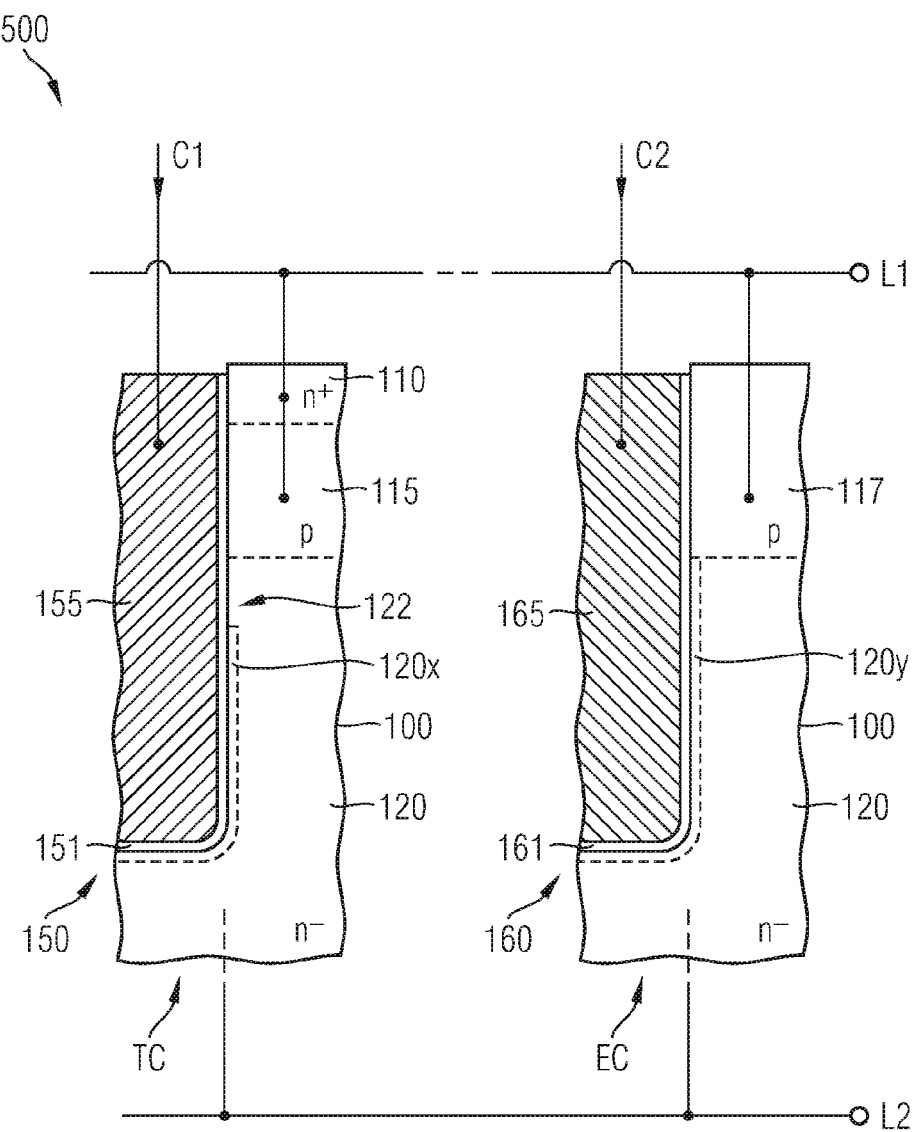
FIG. 2C includes cross-sectional views of portions of a semiconductor device according to an embodiment concerning transistor cells with interrupted inversion layers in the drift structure.

In FIG. 2C an interruption 122 disconnects at least a portion of a further inversion layer 120x, which is formed in the drift structure 120 along a portion of a first gate structure 150, from the body zones 115x at least when the first control signal C1 does not exceed a maximum allowed voltage range specified for the low level in a datasheet of the semiconductor device 500. The interruptions 122 are formed in or along the drift structure 120 and close to the first pn junctions pn1.

Figure 2D:
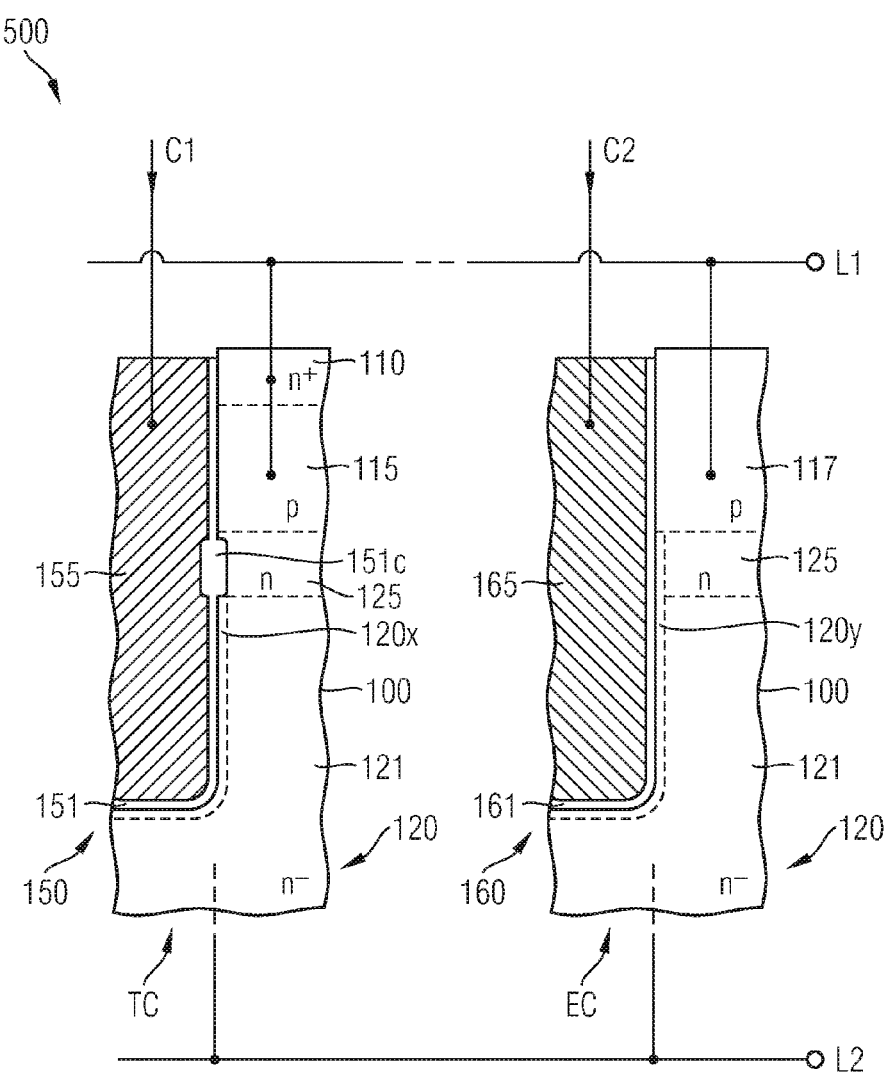
FIG. 2D includes cross-sectional views of portions of a semiconductor device according to an embodiment concerning transistor cells which gate dielectrics include beak portions.

FIG. 2D shows a first gate dielectric 151 with a beak portion 151c. The beak portion 151c is thicker than a portion of the first gate dielectric 151 outside the beak portion 151c. The beak portion 151c locally reduces the threshold voltage for forming an inversion layer in the drift structure 120 and may be effective as the interruption 122 of FIG. 2C.

The drift structure 120 may include a lightly doped drift zone 121 and more heavily doped barrier zones 125 sandwiched between the drift zone 121 and the body zones 115. The beak portion 151c may directly adjoin the neighboring barrier zone 125. The beak portion 151c may extend into the first gate structure 150, into the drift structure 120, or into both.

Figure 2E:
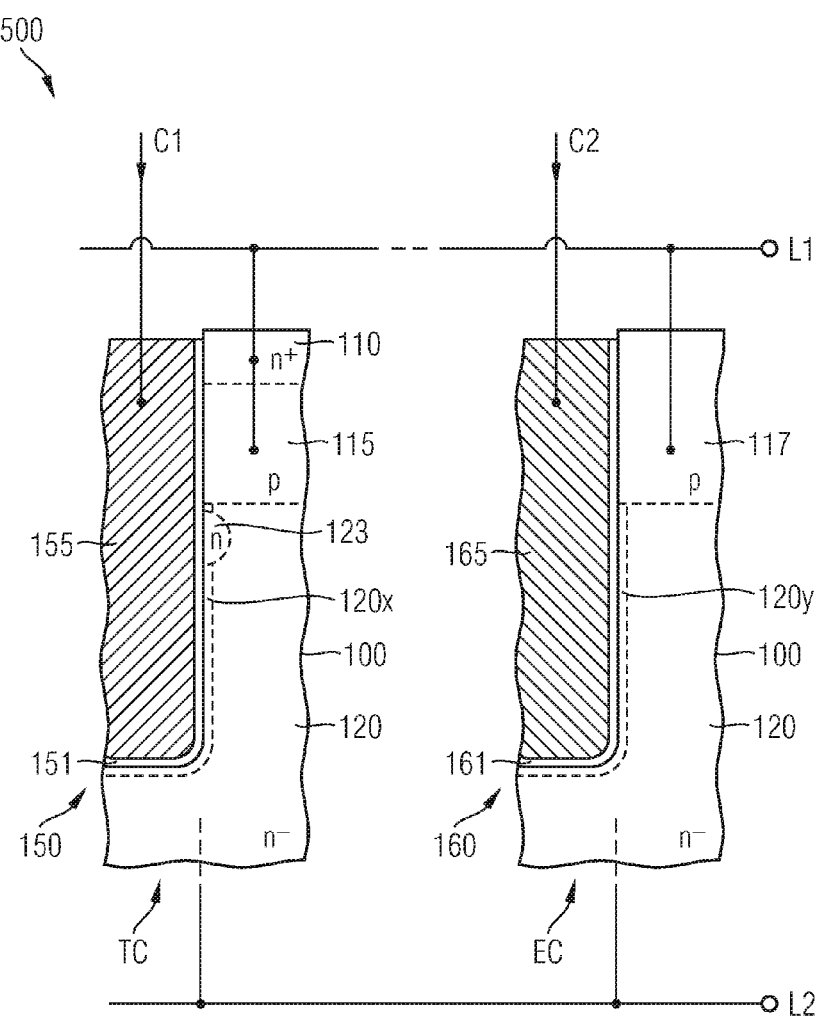
FIG. 2E includes cross-sectional views of portions of a semiconductor device according to an embodiment concerning transistor cells with doped interruption zones in the drift structure.

FIG. 2E shows transistor cells TC with heavily doped interruption zones 123 formed in portions of the drift structure 120 directly adjoining the first gate structures 150. The heavily doped interruption zones 123 locally increase the threshold voltage for forming an inversion layer in the drift structure 120 and may shift the local threshold voltage to below the minimum low level of the first control signal C1.

For restoring full blocking capability during the safety period, the enhancement cells EC do not form any inversion channel that connects the drift structure 120 with the first load electrode 310 even when the second control signal C2 exceeds the first threshold at which the transistor cells TC form the inversion channels 115x. The enhancement cells EC may form secondary inversion layers in the charge carrier transfer zones 117 not at all or only such secondary inversion layers that are without connection to the first load electrode 310.

In FIG. 3A the enhancement cells EC include charge carrier transfer zones 117 and contact structures 305 extending from the first load electrode 310 through openings in a dielectric structure 210 into the charge carrier transfer zones 117. When the second control signal C2 exceeds the first threshold, the enhancement cells EC form secondary inversion layers 117y along the second gate structures 160 in the charge carrier transfer zones 117.

The enhancement cells EC are devoid of any doped zone that is separated from the drift structure 120, has the conductivity type of the drift structure 120, and is electrically connected to the first load electrode 310. In other words the enhancement cells EC are devoid of any doped zone through which the secondary inversion layers 117y can be electrically connected with the first load electrode 310.

The charge carrier transfer zones 117 fill portions of the semiconductor body 100 that directly adjoin first end portions of the second gate structures 160 along an interface to the dielectric structure 210. The secondary inversion layers 117y extend through the charge carrier transfer zones 117 from the drift structure 120 to the dielectric structure 210.

Figure 3B:
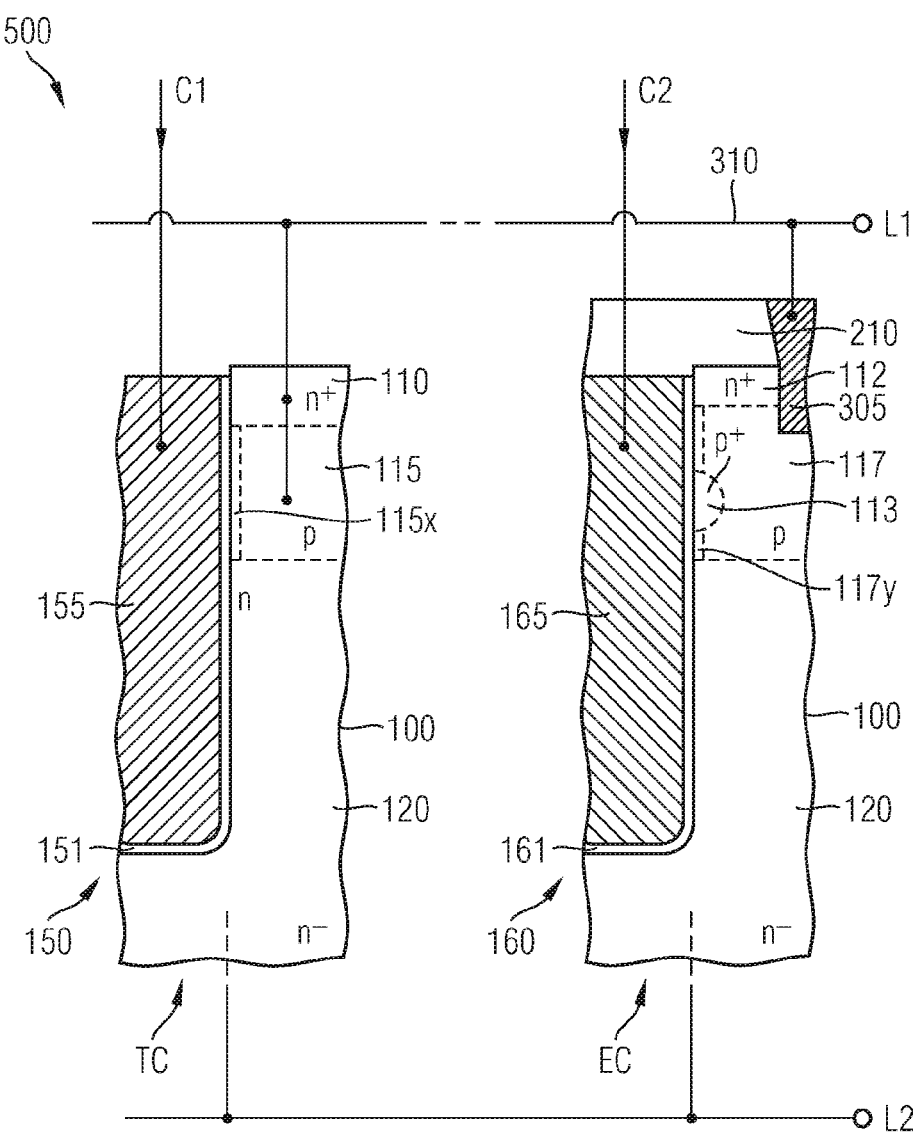
FIG. 3B includes schematic cross-sectional views of portions of a semiconductor device according to an embodiment concerning enhancement cells with doped interruption zones between drift structure and doped zones.

In FIG. 3B, the enhancement cells EC include doped regions 112 electrically connected to the first load electrode 310 through first contact structures 305. The enhancement cells EC further include heavily doped second interruption zones 113 formed along the second gate structure 160 and forming a unipolar homojunction with the charge carrier transfer zone 117. The second interruption zones 113 locally increase the threshold voltage for forming the secondary inversion layers 117y and shift the threshold for forming contiguous secondary inversion layers 117y to a value above the highest allowed level for the second control signal C2, i.e., to beyond the high level. The doped regions 112 remain disconnected from the drift structure 120 even when the transistor cells TC form inversion channels 115x.

First sections of the second gate dielectrics 161 that separate the second gate electrodes 165 from the charge carrier transfer zones 117 may be thicker than second sections separating the second gate electrodes 165 from the drift structure 120.

FIG. 4A concerns a desaturable semiconductor diode 501, which semiconductor body 100 is based on a crystalline semiconductor material, for example Si, SiC, Ge, SiGe, GaN, GaAs or any other $A_{III}B_V$ semiconductor.

At a front side the semiconductor body 100 has a first surface 101 which may be approximately planar or which may be defined by a plane spanned by coplanar surface sections. A planar second surface 102 at the opposite rear side is parallel to the first surface 101.

A minimum distance between the first and second surfaces 101, 102 is selected to achieve a specified voltage blocking capability of the semiconductor diode 501 and may be at least 20 μm. For example, the distance between the first and second surfaces 101, 102 may be in a range from 90 μm to 110 μm for a semiconductor diode 501 specified for a blocking voltage of about 1200 V. Other embodiments related to semiconductor diodes 501 with higher blocking capability may provide semiconductor bodies 100 with a thickness of several 100 μm.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are horizontal directions.

The semiconductor body 100 includes a drift structure 120 of a first conductivity type and a pedestal layer 130 sandwiched between the drift structure 120 and the second surface 102.

For the illustrated embodiments the first conductivity type is n-type and the second conductivity type is p-type. Similar considerations as outlined below apply to embodiments with the first conductivity type being p-type and the second conductivity type being n-type.

The drift structure 120 may include a lightly doped drift zone 121 and a more heavily doped buffer or field stop zone 129 sandwiched between the drift zone 121 and the pedestal layer 130. A dopant concentration in the drift zone 121 may gradually or in steps increase or decrease with increasing distance to the first surface 101 at least in portions of its vertical extension. According to other embodiments the dopant concentration in the drift zone 121 may be approximately uniform. A mean dopant concentration in the drift zone 121 may be between $1E12$ cm$^{-3}$ and $1E15$ cm$^{-3}$, for example in a range from $5E12$ cm$^{-3}$ to $5E13$ cm$^{-3}$. A mean dopant concentration in the buffer or field stop zone 129 is at least five times, for example at least ten times as high as the mean dopant concentration in the drift zone 121.

The pedestal layer 130 has the same conductivity type as the drift zone 121 and forms a unipolar homojunction with the drift structure 120. A maximum dopant concentration for the pedestal layer 130 along the second surface 102 is sufficiently high to ensure an ohmic contact with a metal structure directly adjoining the second surface 102.

Semiconducting portions of transistor cells TC include body zones 115 forming first pn junctions pn1 with the drift structure 120 and source zones 110 forming second pn junctions pn2 with the body zones 115. Semiconducting portions of enhancement cells EC include charge carrier transfer zones 117 forming further first pn junctions pn1 with the drift structure 120. A total dopant quantity (effective dose) in the charge carrier transfer zones 117 may be set such that at the operation conditions the semiconductor device 500 is specified for, the charge carrier transfer zones 117 prevent a depletion region extending from the first pn junction pn1 between the charge carrier transfer zone 117 and the drift structure 120 from reaching the first surface 101 or a contact structure that extends from the first surface 101 into the semiconductor body 100. For example, the total dopant quantity in the charge carrier transfer zones 117 may be the result of a p-type implant dose of about $5E12$ cm$^{-2}$ and a following etch of contact grooves that removes portions of the implanted areas.

In the illustrated embodiment, at least some of the charge carrier transfer zones 117 directly adjoin one of the body zones 115, respectively. According to other embodiments, the charge carrier transfer zones 117 may be separated from the body zones 115. The charge carrier transfer zones 115 may directly adjoin the first surface 101 and may be sandwiched between the first surface 101 and the drift structure 120.

The drift structure 120 may include barrier zones 125 sandwiched between the body zones 115 and the drift zone 121 and/or between the charge carrier transfer zones 117 and the drift structure 120. The barrier zones 125 have the first conductivity type and may form unipolar homojunctions with the drift zone 121. A mean dopant concentration in the barrier zones 125 is at least ten times as high as a mean dopant concentration in the drift zone 121. According to an embodiment, the mean dopant concentration in the barrier zones 125 may range from $1E16$ cm$^{-3}$ to $1E18$ cm$^{-3}$, for example from $1E17$ cm$^{-3}$ to $5E17$ cm$^{-3}$. The dopants may be phosphorus (P), arsenic (As), selenium (Se) and/or sulfur (S) atoms/ions. The barrier zones 125 may or may not include a lower doped portion with the dopant concentration of the drift zone 121 on a side oriented to the body zones 115 and the charge carrier transfer zones 117.

When the first pn junctions pn1 are forward biased the body zones 115 as well as the charge carrier transfer zones 117 inject minority charge carriers through the barrier zones 125 into the drift zone 121, wherein the higher the doping in the barrier zones 125 is the lower is the emitter efficiency of the body and charge carrier transfer zones 115, 117. The body zones 115 as well as the charge carrier transfer zones 117 are effective as anode region. The pedestal layer 130 is effective as cathode region.

First and second gate structures 150, 160 may extend from the first surface 101 into the semiconductor body 100 at least down to the drift structure 120. According to the illustrated embodiment the first and second gate structures 150, 160 extend into the drift structure 120. The first gate structures 150 include a conductive first gate electrode 155 and a first gate dielectric 151 separating the first gate electrode 155 from the semiconductor body 100. The second gate structures 160 include a conductive second gate electrode 165 and a second gate dielectric 161 separating the second gate electrode 165 from the semiconductor body 100.

The thickness of the first gate dielectrics 151 may be uniform. According to other embodiments, second sections of the first gate dielectrics 151 oriented to the second surface 102 may be thicker than first sections oriented to the first surface 101.

The first gate electrode 155 and the second gate electrode 165 may be homogenous structures or may have a layered structure including one or more metal containing layers. According to an embodiment at least one of the first and second gate electrodes 155, 165 may include or consist of a heavily doped polycrystalline silicon layer. The first and second gate electrodes 155, 165 may consist of the same materials, may have the same configuration, and may result from the same deposition and patterning process.

Each of the first and second gate dielectric 151, 161 may include or consist of a semiconductor oxide, for example thermally grown or deposited silicon oxide, a semiconductor nitride, for example deposited or thermally grown silicon nitride, or a semiconductor oxynitride, for example silicon oxynitride. The first and second gate dielectrics 151, 161 may consist of the same material(s), may have the same configuration, and may result from the same deposition and patterning process. Portions of the semiconductor body 100 between neighboring gate structures 150, 160 form mesa sections 170 that include the body zones 115, the source zones 110, the charge carrier transfer zones 117, portions of the drift zone 121, and, if applicable, the barrier zones 125.

The first gate structures 150 and adjoining portions of neighboring mesa sections 170 including the source and body zones 110, 115 form the transistor cells TC. The second gate structures 160 and adjoining portions of neighboring mesa sections 170 including the charge carrier transfer zone 117 form the enhancement cells EC.

The transistor cells TC of the semiconductor diode 501 may be arranged not to form inversion layers in the drift structure 120, which are connected to the body zones 115 and which enhance hole emitter efficiency in the forward-biased mode. The transistor cells TC may embody, e.g., any of the transistor cells TC described with reference to FIGS. 2A to 2E.

The enhancement cells EC of the semiconductor diode 501 are arranged not to form, in the charge carrier transfer zone 117, an inversion channel through which minority charge carriers may flow between the drift structure 120 and a first load electrode 310 when a positive voltage exceeding the first threshold is applied to the second gate structures 160 and may embody any of the enhancement cells EC described with reference to FIGS. 3A to 3B.

According to the illustrated embodiment the charge carrier transfer zones 117 may directly adjoin the second gate structures 160 at the first surface 101 such that between the first surface 101 and the charge carrier transfer zones 117 the concerned mesa sections 170 are devoid of any doped regions of the first conductivity type at least along the second gate structures 160. A dielectric structure 210 may be formed on the first surface 101 on both sides of the vertical projections of the interfaces between the charge carrier transfer zones 117 and the second gate structures 160, respectively. The resulting absence of a doped region of the first conductivity type along the first surface 101 at the outer edge of the second gate structure 160 inhibits an electron path through the charge carrier transfer zone 117.

A distance between the first surface 101 and a bottom of the first and second gate structure 150, 160 may range from 1 μm to 30 μm, e.g., from 3 μm to 7 μm. A lateral width of the mesa sections 170 may range from 0.05 μm to 10 μm, e.g., from 0.15 μm to 1 μm. A distance between the first surface 101 and the first pn junction pn1 may range from 0.5 μm to 5 μm, e.g., from 1 μm to 1.5 μm.

The first load electrode 310, which forms the anode electrode of the semiconductor diode 501, is electrically connected to the body zones 115, the source zones 110 and the charge carrier transfer zones 117. The first load electrode 310 may form or may be electrically coupled or connected to the anode terminal A of the semiconductor diode 501.

A second load electrode 320 directly adjoins the second surface 102 and the pedestal layer 130. The second load electrode 320 may form or may be electrically connected to a cathode terminal K of the semiconductor diode 501.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

The dielectric structure 210 may be sandwiched between the first load electrode 310 and the semiconductor body 100. The dielectric structure 210 may include one or more layers of semiconductor oxide, for example silicon oxide, semiconductor nitride, for example silicon nitride, or semiconductor oxynitride, for example silicon oxynitride, which may be layers thermally grown on the semiconductor body 100 or deposited layers. Contact structures 305 extend through openings of the dielectric structure 210 and electrically connect the first load electrode 310 with the source zones 110, the body zones 115 and the charge carrier transfer zones 117.

The first and second gate electrodes 155, 165 are electrically connected or coupled to a delay unit 400. The delay unit 400 delays trailing edges of a second control signal C2 applied to the second gate electrodes 165 with respect to corresponding trailing edges of a first control signal C1 applied to the first gate electrodes 155. According to an embodiment, the first control signal C1 may be supplied to the delay unit 400 through a gate terminal G or through a driver output of an internal gate driver circuit.

According to the illustrated embodiment, the delay unit 400 may be electrically connected to the gate terminal G or the driver output of an internal gate driver circuit and outputs both the first control signal C1 and the second control signal C2.

The transistor cells TC form a MOS gated inversion channel between the source zones 110 and the drift structure 120 when the first control signal C1 exceeds a positive first threshold voltage Vthx. The first threshold voltage Vthx may be between 5.5 and 6.5 V, by way of example.

The enhancement cells EC do not form an inversion channel that connects the drift structure 120 with the first load electrode 310 when the second control signal C2 exceeds the first threshold voltage Vthx. Instead, the enhancement cells EC form inversion layers in the drift structure 120 along the second gate structures 160 when the second control signal C2 falls below a second threshold Vthy, which may be between −5.5 V and −6.5 V, by way of example.

The first control signal C1 may alternate between a high level, which may be about +15V, and a low level, which may be about −15V. The second control signal C2 may be a similar signal with the same high and low levels.

The transistor cells TC may form or may not form further inversion layers along the first gate structures 150 in the drift structure 120 when the first control signal C1 falls below the second threshold Vthy.

In the illustrated embodiment, the first gate dielectrics 151 include beak portions 151c in which the first gate dielectrics 151 are wider than outside the beak portions 151c. The width of the beak portions 151c is selected such that no inversion layer is formed along the beak portions at the lowest allowed signal level for the first control signal C1.

A gate signal, from which the first and second control signals C1, C2 are derived from, may be a square signal. The first control signal C1 may be approximately a square signal which edges may be slightly delayed with respect to the corresponding edges in the gate signal. The second control signal C2 is in substance a square signal which trailing edges are significantly delayed with respect to corresponding trailing edges of the first control signal C1. The leading edges of the second control signal C2 may be slightly delayed to the corresponding leading edges of the first control signal C1. According to an embodiment, exclusively the trailing edges of the second control signal C2 are delayed with respect to the corresponding trailing edges of the first control signal C1.

FIG. 4B reflects the diagram of FIG. 1C for the semiconductor diode 501 of FIG. 4A.

The first control signal C1 is a square signal alternating between a negative low level VGL and a positive high level VGH. The second control signal C2 follows the leading edges of the first control signal C1. At the trailing edges, the delay unit 400 delays the second control signal C2 with respect to the first control signal C1.

At t=t0, the semiconductor diode 501 of FIG. 4A is forward biased and in a bipolar conduction mode with both types of charge carriers contributing to a load current through the semiconductor diode 501. The enhancement cells EC are active and form p-type inversion layers connected through the charge carrier transfer zones 117 to the first load electrode 310, which is effective as anode electrode. The enhancement cells EC significantly increase the anode emitter efficiency as well as a charge carrier plasma density in the drift structure 120 and enhance the bipolar conduction mode. The high density charge carrier plasma in the drift zone 121 results in that in the enhanced bipolar conduction mode the anode-to-cathode voltage VAK is defined by a low forward voltage VF1 of the first pn junctions pn1 and a high storage charge Qss.

Between t1 and t2 a desaturation pulse is applied to the gate terminal G. The transistor cells TC immediately form inversion channels through the body zones 115 that bypass the first pn junctions pn1. At the same time the inversion layers of the enhancement cells EC are switched off. Charge carrier plasma density and charge storage Qss decrease.

At t=t2, the desaturation pulse ends and a safety period starts with the transistor cells TC turning off the inversion channels such that the semiconductor diode 501 immediately is able to sustain a blocking voltage. At the same time, the delay unit 400 keeps the inversion layers of the enhancement cells EC disabled for a predetermined period of time. The anode efficiency of the enhancement cells EC remains low such that the charge carrier plasma density and the storage charge Qss increase only to a low degree. Consequently, during the safety period the forward voltage VF2 is higher than in the enhanced bipolar conduction mode.

If a time constant of the delay unit 400 is selected such that the second control signal C2 falls below the second threshold voltage Vthy only after the semiconductor diode 501 changes to reverse biased, the remaining storage charge Qss is low at the time of commutation and switching losses are significantly reduced compared to reference diodes with no delay of the trailing edges of the second control signal C2.

FIG. 5A refers to an RC-IGBT 502. The pedestal layer 130 of the RC-IGBT 502 includes first zones 131 of the second conductivity type and second zones 132 of the first conductivity type. The first and second zones 131, 132 extend from the drift structure 120 to the second load electrode 320. The first zones 131 are effective as rear side emitter zones injecting minority charge carriers into the drift structure 120 in a conducting phase of an IGBT-mode. The second zones 132 are effective as collector shorts bypassing the rear side emitter zones in the RC (reverse conducting) mode.

The first zones 131 may alternate with the second zones 132 in a bimodal region of the RC-IGBT 502. In addition to the bimodal region, the RC-IGBT 502 may include a pilot region with a pilot zone of the second conductivity type, wherein a horizontal extension of the pilot zone is greater than a horizontal extension of the first zones 131. The dopant concentrations in the first and second zones 131, 132 and, if applicable, in a pilot zone, are sufficiently high to ensure a low ohmic contact to the second load electrode 320. For example, a maximum dopant concentration along the second surface 102 in p-doped zones 131, 132 may be at least 1E16 $cm^{-3}$, for example at least 5E17 $cm^{-3}$ and a maximum dopant concentration in n-doped zones 131, 132 may be at least 1E18 $cm^{-3}$, for example at least 5E19 $cm^{-3}$.

The first and second zones 131, 132 may be stripes extending along a first horizontal direction through a transistor cell array including the transistor and enhancement cells TC, EC. According to other embodiments, the first zones 131 may be dot-shaped embedded in a grid formed by the second zones 132 or vice versa.

As regards further details, reference is made to the description of the semiconductor diode 501 in FIG. 4A, wherein the first load electrode 310 forms or is electrically connected or coupled to an emitter electrode E and the second load electrode 320 forms or is electrically connected to a collector terminal C.

Figure 5B:
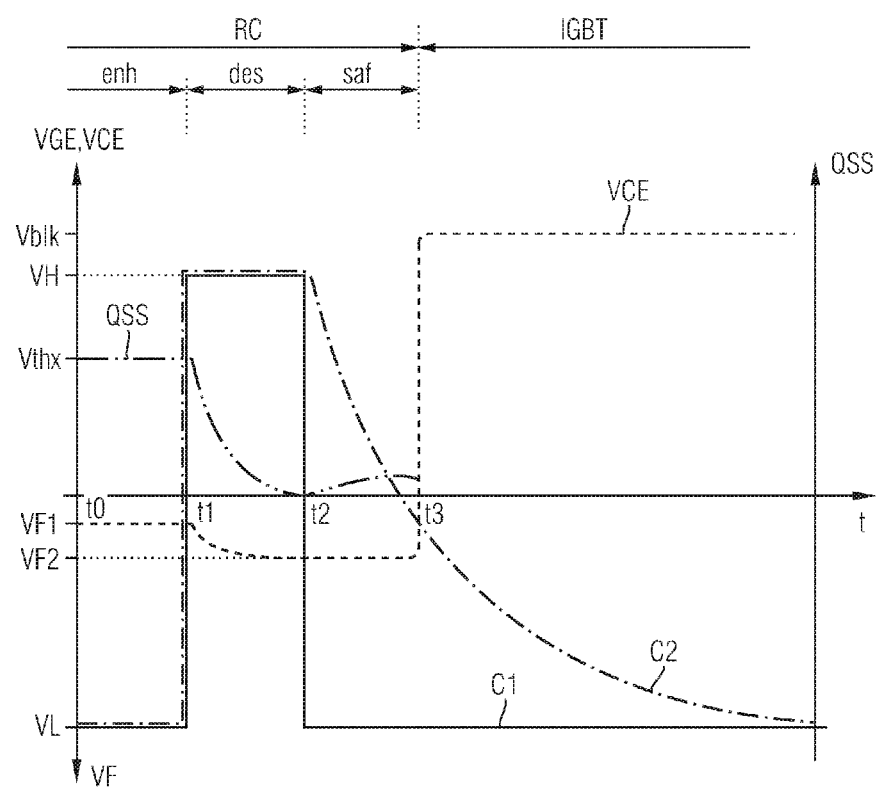
FIG. 5B is a schematic time chart for illustrating a desaturation cycle for the RC-IGBT of FIG. 5A.

FIG. 5B shows the time chart of FIG. 1C for an RC-IGBT as illustrated in FIG. 5A. The first control signal C1 is a square signal alternating between a negative low level VL and a positive high level VH. The second control signal C2 follows immediately the leading edges of the first control signal C1. At the trailing edges, the delay unit 400 delays the second control signal C2 with respect to the first control signal C1.

At t=t0, the RC-IGBT 502 of FIG. 5A is reverse-biased with the internal RC-diode formed by the first pn junctions pn1 forward biased and in a bipolar conduction mode. Both types of charge carriers contribute to the reverse current through the RC-IGBT 502. The enhancement cells EC are active and form p-type inversion layers connected through the charge carrier transfer zones 117 to the first load electrode 310, which is effective as emitter electrode. The enhancement cells EC increase the emitter efficiency of the p-type anode regions of the RC-diode and enhance the bipolar RC mode. The high charge carrier plasma density in the drift zone 121 results in a high storage charge Qss and in that the collector-to-emitter voltage VCE is defined by a low forward voltage VF1 of the RC diode.

At t=t1, a desaturation pulse is applied to the first control signal C1. The transistor cells TC immediately form inversion channels through the body zones 115. The inversion channels bypass the first pn junctions pn1 of the RC diode. The enhancement cells EC switch off the p-type inversion layers in the drift structure 120. As a consequence, charge carrier plasma density and charge storage Qss decrease.

At t=t2, the first control signal C1 immediately returns to the low level VL turning off the inversion channels of the transistor cells TC such that the RC-IGBT 502 can immediately sustain a blocking voltage. The delay of the trailing edge of the second control signals C2 effects that the enhancement cells EC do not form p-type inversion layers in the drift structure 120 for a predefined time period. For that time period, the emitter efficiency of the enhancement cells EC remains low such that starting from t=t2, the charge carrier plasma density and the storage charge Qss increase only to a low degree. Consequently, during the safety period, the absolute value of the forward voltage VF2 of the RC diode is significantly higher than in the enhanced RC mode.

If the predefined time period is selected such that the second control signal C2 does not fall below the second threshold voltage Vthy before the RC-IGBT 502 changes from reverse biased to forward biased at t=t3, the remaining storage charge Qss at the time of commutation is low such that switching losses can be significantly reduced compared to reference RC-IGBTs with no delay of the trailing edges of the second control signal C2.

In the embodiments of FIGS. 4A and 5A, the charge carrier transfer zones 117 directly adjoin the body zones 115. One charge carrier transfer zone 117 and one body zone 115 are formed in the same mesa section 170, respectively.

Figure 6:
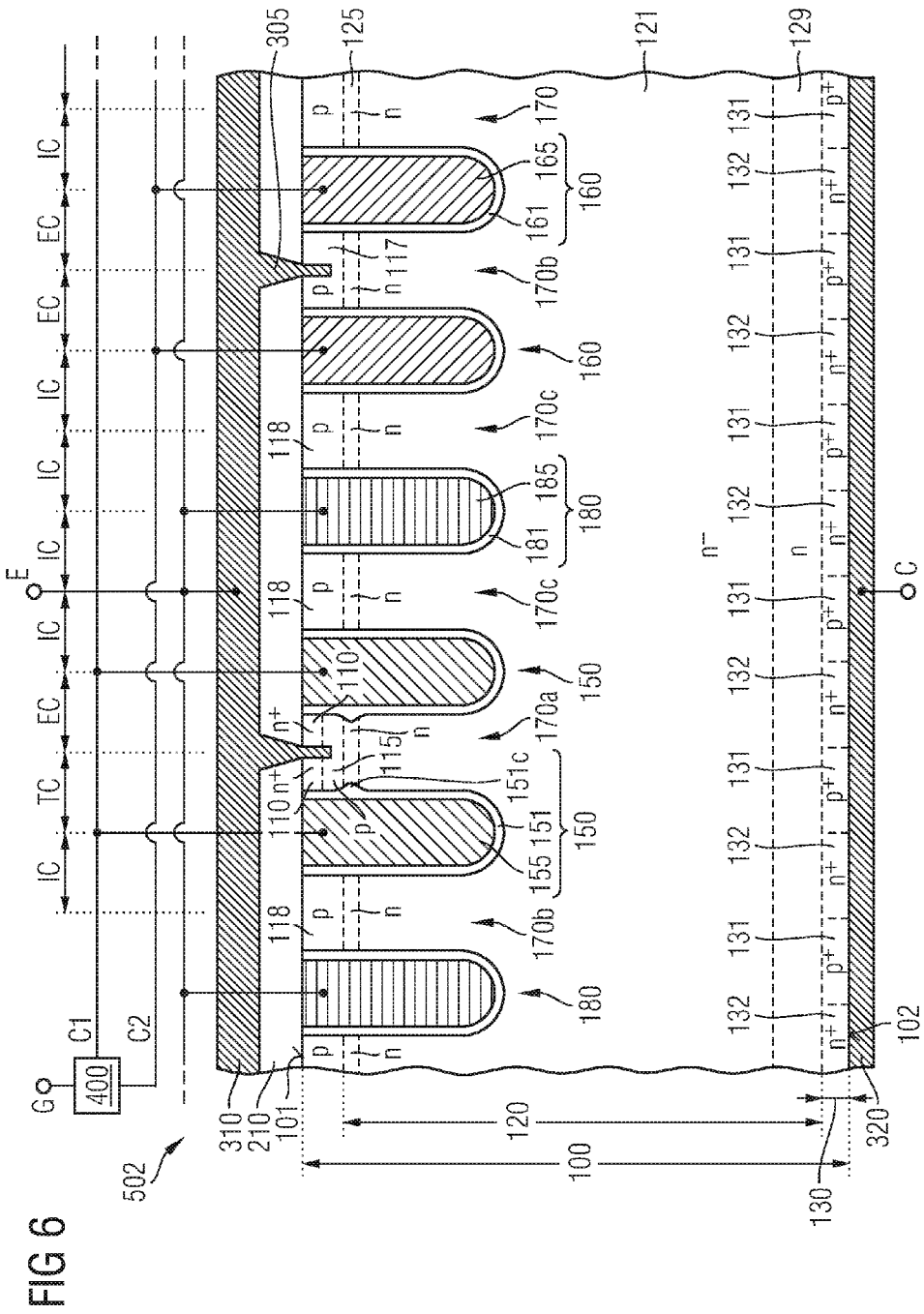
FIG. 6 is a schematic cross-sectional view of a portion of an RC-IGBT according to an embodiment concerning idle cells.

FIG. 6 refers to an embodiment with the body zones 115 formed separated from the charge carrier transfer zones 117.

The semiconducting portions of two neighboring transistor cells TC are formed in transistor mesa sections 170a between neighboring first gate structures 150. Charge carrier transfer zones 117 of two neighboring enhancement cells EC may be formed in diode mesa sections 170b between neighboring second gate structures 160. In addition, the RC-IGBT 502 may include idle cells IC with idle mesa sections 170c without direct electrical connection to the first load electrode 310. The idle mesa sections 170c may be formed between a first and a second gate structure 150, 160, between two first gate structures 150, or between two second gate structures 160, by way of example, and may or may not include p-doped regions 118 without electrical connection to the first load electrode 310.

According to an embodiment, the idle mesa sections 170c may directly adjoin a field electrode structure 180 extending from the first surface 101 into the drift structure 120. The field electrode structures 180 may include a field electrode 185 and a field dielectric 181 electrically separating the field electrode 185 from the semiconductor body 100, respectively. The field electrode structures 180 may have horizontal and vertical dimensions similar or identical to the dimensions of at least one of the first and second gate structures 150, 160.

The field electrodes 185 may be homogeneous structures from a conductive material such as polycrystalline silicon or may have a layered structure including one or more metal containing layer(s), respectively. According to an embodiment the field electrodes 185 may be provided from the same material(s) as at least one of the first and second gate electrodes 155, 165.

The field dielectrics 181 may be homogeneous structures from one dielectric material such as a semiconductor oxide, or may have a layered structure including two or more layer of dielectric materials, wherein the dielectric materials include thermally grown semiconductor oxide, for example thermally grown silicon oxide, deposited semiconductor oxide, for example deposited silicon oxide, silicon nitride or silicon oxynitride, by way of example. According to an embodiment, the field dielectrics 181 may be provided from the same material(s) as at least one of the first and second gate dielectrics 151, 161. The idle mesa sections 170c and adjoining portions of field or gate structures 150, 160, 180 form the idle cells IC.

Enhancement and transistor cells EC, TC may be formed side by side and alternate along at least one horizontal direction. FIGS. 7A to 7C refer to embodiments where at least some of the enhancement cells EC are stacked vertically with the transistor cells TC.

In FIG. 7A the RC-IGBT 502 includes combined gate structures 190 including a second gate structure 160 and a first gate structure 150 in the vertical projection of the second gate structure 160 between the first surface 101 and the second gate structure 160. An auxiliary dielectric 205 separates the first gate structure 150 from the second gate structure 160. The auxiliary dielectric 205 may be approximately aligned with the first pn junctions pn1.

According to an embodiment, the distance of the first dielectric 205 to the first surface 101 alternates in a horizontal direction vertical to the cross-sectional plane such that in first sections the first gate structures 150 overlap with the drift structure 120 to facilitate the connection of the inversion channels of the transistor cells TC to the drift structure 120 and such that in second sections the second gate electrodes 165 overlap with the body zones 115 to facilitate the connection of the p-type inversion layers with the body zones 115.

According to another embodiment, the distance of the first dielectric 205 to the first surface 101 does not alternate in the horizontal direction vertical to the cross-sectional plane such that in first cells including the transistor cells TC the first gate structures 150 overlap with the drift structure 120 to facilitate the connection of the inversion channels of the transistor cells TC to the drift structure 120 and such that in second cells including the enhancement cells EC the second gate electrodes 165 overlap with the body zones 115 to facilitate the connection of the p-type inversion layers with the body zones 115. For each cell the electrodes in the upper and the lower portion may be electrically connected or coupled to each other, e.g., by openings in the first dielectric 205 or by a wire connection, for example, in a metallization plane.

The RC-IGBT 502 of FIG. 7B includes bulgy combined gate structures 190 as well as bulgy second gate structures 160. Mesa sections 170 between the gate structures 160, 180 include wide portions including the source zones 110, body zones 115, and charge carrier transfer zones 117 and narrowed portions between the wide portions and a contiguous portion of the drift structure 120. For the non-enhanced mode, the bulgy portions of the gate structures 160, 190 shield the body zones 115 and the charge carrier transfer zones 117 and further decrease the anode emitter efficiency in the non-enhanced bipolar conduction mode, for example during the safety period of the desaturation cycle.

According to the embodiment of FIG. 7C, combined gate structures 190 directly adjoin to each other defining active mesa sections 170a between them. According to the illustrated embodiment, the auxiliary dielectrics 205 are formed at different distances to define transistor cells TC where the auxiliary dielectrics 205 are sufficiently spaced from the first surface 101 to allow an inversion channel through the body zones 115 to be connected to the drift zone 121 as well as enhancement cells EC where the auxiliary dielectrics 205 are formed sufficiently close to the first surface to allow inversion layers formed in the drift zone 121 to be connected to the body zones 115.

Figure 8A:
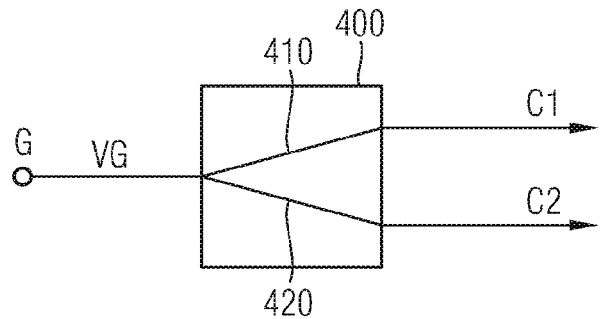
FIG. 8A is a schematic block diagram of a delay unit according to an embodiment.
Figure 8B:
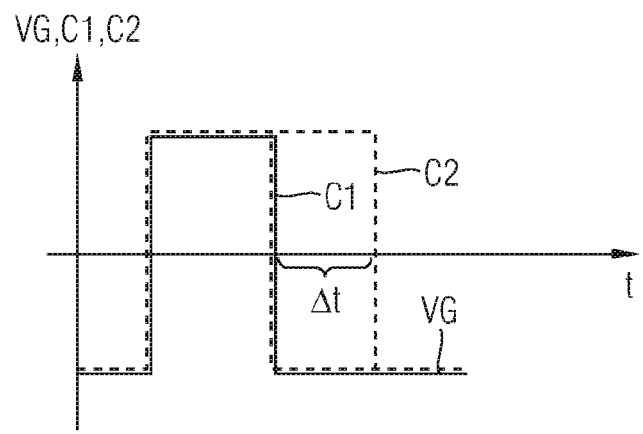
FIG. 8B is a simplified time chart for illustrating the mode of operation of the delay unit of FIG. 8A.
Figure 8C:
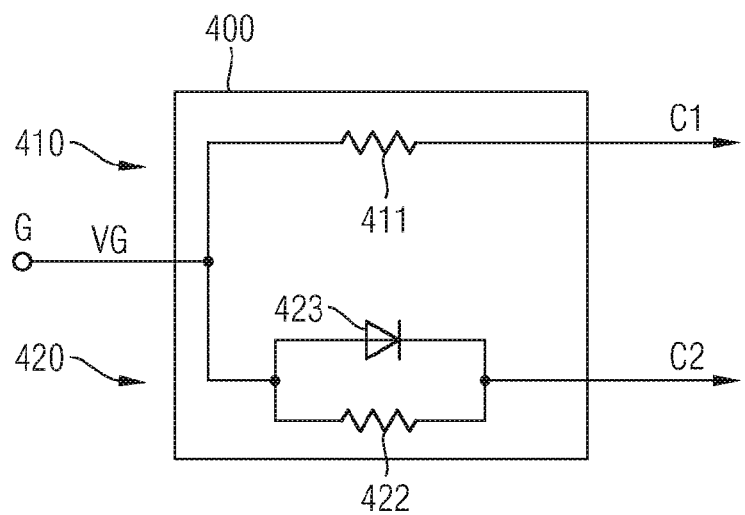
FIG. 8C is a schematic circuit diagram of a delay unit according to an embodiment with a rectifying element.

FIGS. 8A to 8C refer to embodiments of the delay unit 400. The delay unit 400 may include a first path 410, which is electrically connected or coupled to a gate node, and a second path 420, which is electrically connected or coupled to the gate node. The gate node may be a gate terminal G or a driver output of an internal gate driver circuit. The first path 410 outputs a first control signal C1 that approximately follows a gate signal VG applied to the gate node through the gate terminal G or through the internal gate driver circuit. The first control signal C1 may be slightly delayed with regard to the gate signal with respect to a minimum pulse length of the gate signal VG, which may be a square signal. The second path 420 outputs a second control signal C2 in response to the gate signal, wherein trailing edges of the second control signal C2 are significantly delayed with respect to corresponding trailing edges of the first control signal C1.

FIG. 8B shows a time chart of the signals VG, C1, C2 of FIG. 8A. The trailing edge of the second control signal C2 is delayed by $\Delta t$ with respect to the trailing edge of the first control signal C1, which approximately follows the gate signal VG.

FIG. 8C shows an embodiment of the delay unit 400. The first path 410 includes a first internal resistance 411 which may be the intrinsic resistance of a gate conductor wiring of the transistor cells. The second path 420 includes a second internal resistance 422, which may include a discrete resistor element in addition to the intrinsic line resistance of a gate wiring of the enhancement cells. In addition, the second path 420 may include a rectifying element 423 electrically connected in parallel to the second internal resistance 422 and bypasses the second internal resistance 422 for leading edges of the gate signal VG. The second internal resistance 422 is greater than the first internal resistance 411. The rectifying element 423 may be a semiconductor diode based on polycrystalline silicon deposited in an interlayer dielectric separating the first load electrode from the semiconductor body 100.

Figure 8D:
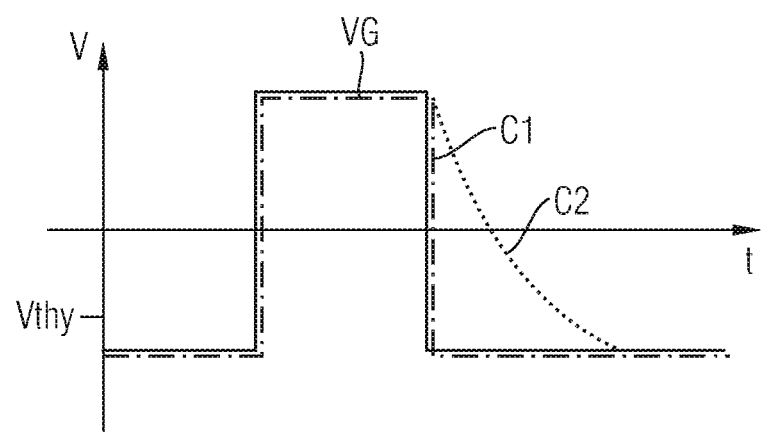
FIG. 8D is a simplified time chart for illustrating the mode of operation of the delay unit of FIG. 8C.

FIG. 8D shows the first and second control signals C1, C2 output by the delay unit 400 of FIG. 8C.

Figure 9B:
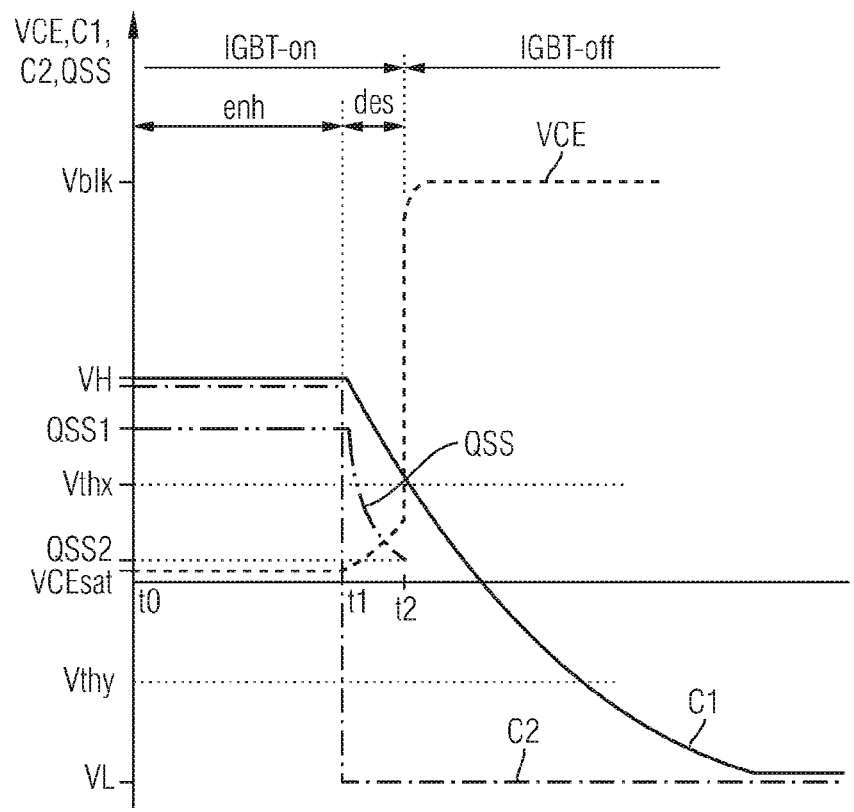
FIG. 9B is a schematic simplified time chart for illustrating a desaturation cycle of the IGBT of FIG. 9A.
Figure 9C:
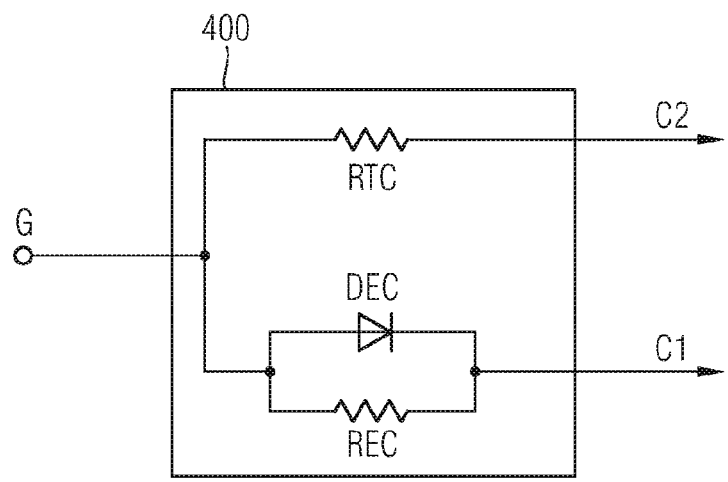
FIG. 9C is a schematic circuit diagram of a delay unit of the non-reverse conducting IGBT of FIG. 9A according to an embodiment.

FIGS. 9A to 9C refer to a non-reverse conducting IGBT 503. The pedestal layer 130 of the IGBT 503 may be a contiguous layer with a conductivity type opposite to the conductivity type of the drift structure 120. According to other embodiments, the pedestal layer 130 may include micro channels of the conductivity type of the drift structure 120, wherein the micro channels do not adversely affect the reverse blocking capability of the non-reverse conducting IGBT 503, for example micro channels that are fully depleted in a blocking mode. Other than the delay unit 400 of the previous embodiments, the delay unit 400 of the non-reverse conducting IGBT 503 delays trailing edges of the first control signal C1 with respect to corresponding trailing edges of the second control signal C2. For further details, reference is made to the description of the RC-IGBT 502 in the previous Figures.

FIG. 9B shows the effect of the delay unit 400 on the behavior of the transistor and enhancement cells TC, EC of the IGBT 503 of FIG. 9A. The second control signal C2 may be a square signal alternating between a negative low level VL and a positive high level VH. The first control signal C1 may follow immediately the leading edges of the second control signal C2. The delay unit 400 delays the trailing edges of the first control signal C1 with respect to corresponding trailing edges of the second control signal C2.

At t=t0 the non-reverse conducting IGBT 503 of FIG. 9A is forward biased with a positive collector-to-emitter voltage VCE between the collector and emitter terminals C, E. The bipolar conduction mode of the IGBT 503 results in a low collector-to-emitter saturation voltage VCEsat.

At t=t1 the second control signal C2 immediately falls to below the second threshold Vthy. The enhancement cells EC become active by forming p-type inversion layers in the drift structure 120. Through the p-type inversion layers and the body and charge carrier transfer zones 115, 117 holes are actively drained off to the emitter side such that charge carrier plasma density and storage charge Qss decrease. At the same time, the delay unit 400 keeps the trailing edge of the first control signal C1 above the first threshold Vthx such that the MOS-gated channels of the transistor cells TC are still active. Due to the reduced charge carrier plasma density the collector-to-emitter voltage VCE slightly increases.

When at t=t2 the first control signal C1 falls below the first threshold Vthx, the IGBT 503 changes from the bipolar conduction phase (on-state) of the IGBT mode to the blocking phase of the IGBT mode (off-state) and the collector-to-emitter voltage VCE corresponds to the applied blocking voltage Vblk.

The delay unit 400 may be any of the delay units 400 for the RC-IGBT as discussed with respect to FIGS. 8A to 8D with the first path outputting the second control signal C2 and the first path outputting the first control signal C1.

According to an embodiment at least at the end phase of an IGBT on-state the applied gate signal may change between the high level and the low level VH, VL at a rate significantly higher than a switching rate of the IGBT 503. The pulse pattern may keep the first control signal C1 above the first threshold Vthx but pulses the second control signal C2 to below the second threshold Vthy.

Figure 10A:
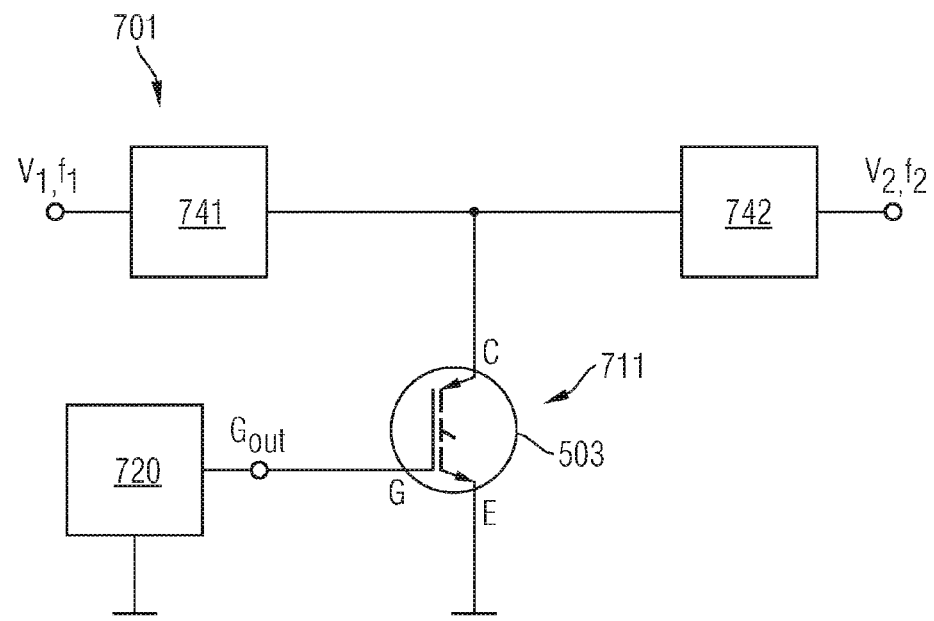
FIG. 10A is a schematic circuit diagram of a switched-mode power supply according to a further embodiment.

FIG. 10A concerns a switched-mode power supply 701 with one of the RC-IGBTs 502 or reverse blocking IGBTs 503 of the previously described embodiments used as a switching device 711. A gate driver circuit 720 generates a gate signal at an output terminal Gout. The gate signal is supplied to a gate terminal G of the switching device 711. The switching device 711 controls storing energy received from a source at a first voltage and a first frequency f1 in an inductive element 741, e.g., a transformer winding or a storage choke, and releasing the stored energy to a load 742 at a second frequency f2 and/or second voltage level V2, wherein f1 and/or f2 may be 0 Hz. The gate signal may be a square signal of a frequency that may be continuously adapted to load conditions. The gate driver circuit 720 may further output a desaturation pulse, e.g., before a collector-to-emitter voltage is reversed or before a load current through the switching device 711 is turned off.

The switched-mode power supply 701 may be of a hard switched type. According to another embodiment the switched-mode power supply may be of the resonant type with the switching device 711 switching only when the voltage across the load terminals C, E of the switching device 711 is at or close to 0V. The switched-mode power supply 701 may be of the buck or boost converter type, by way of example. According to an embodiment, the switched-mode power supply may be a DC/DC converter.

Figure 10B:
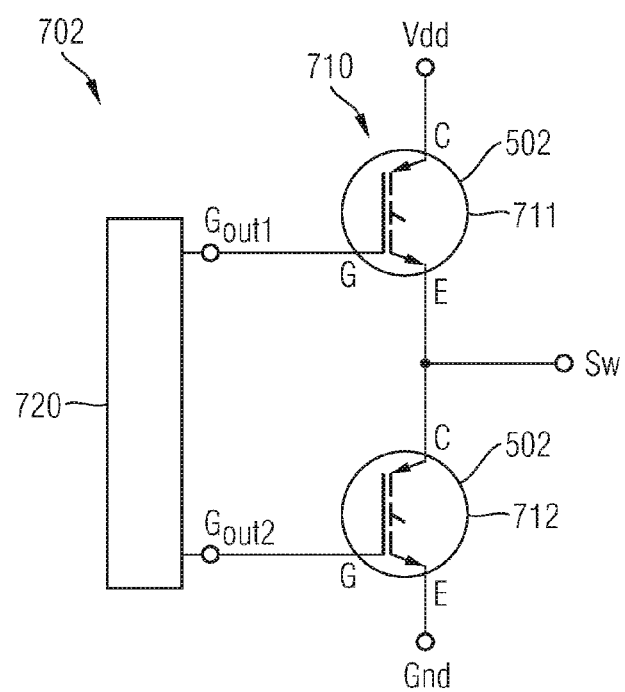
FIG. 10B is a schematic circuit diagram of a half-bridge circuit according to an embodiment with n-type high side switch.

FIG. 10B refers to an electronic circuit 702 including one or more half-bridge circuits 710 based on two semiconductor switching devices 711, 712 which load current paths are connected in series between Vdd and Gnd. The semiconductor switching devices 711, 712 may be RC-IGBTs. At least one of the semiconductor switching devices 711, 712 may be or may include one of the RC-IGBTs 502 of the previous figures. The half-bridge circuit 710 or the complete electronic circuit 702 may be integrated in a power module. For example, the semiconductor switching devices 711, 712 may be mounted, e.g., soldered on a power electronic substrate such as a DBC (direct bonded copper) substrate.

The electronic circuit 702 may include a gate driver circuit 720 generating and driving a first gate signal at a first driver terminal Gout1 and a second gate signal at a second driver terminal Gout2. The first and second driver terminals Gout1, Gout2 are electrically coupled or connected to gate terminals G of the semiconductor switching devices 711, 712. The gate driver circuit 720 controls the gate signals such that during regular switching cycles the first and second switching devices 711, 712 are alternatingly in the on state. During desaturation cycles, the gate driver circuit 720 may supply a desaturation pulse to one of the switching devices 711, 712 to desaturate the reverse conducting diode of the concerned device before starting commutation by turning off the other one of the switching devices 712, 711.

In FIG. 10B the switching devices 711, 712 are n-IGBTs with an emitter terminal E of the first switching device 711 and a collector terminal C of the second switching device 712 electrically connected to a switching terminal Sw. According to another embodiment, the first switching device 711 electrically connected between a positive supply voltage Vdd and the switching terminal Sw may be a p-IGBT.

FIGS. 11A to 11D illustrate a sequence of processes for forming gate dielectrics with reinforced sections for transistor cells of semiconductor devices as described above.

A semiconductor substrate 500a consists of or includes a semiconductor layer 100a of a crystalline semiconductor material, which may be single crystalline silicon Si, SiC, Ge, SiGe, GaN, GaAs or another $A_{III}B_V$ semiconductor. The semiconductor substrate 500a may include further semiconductor and dielectric layers in addition to the semiconductor layer 100a. According to an embodiment, the semiconductor substrate 500a is a silicon wafer, wherein the semiconductor layer 100a may either be a silicon disc obtained by cutting a silicon crystal or a semiconductor layer entirely or in portions formed by epitaxy on a single crystalline substrate. The semiconductor layer 100a may include two or more sub-layers of different conductivity types or of the same conductivity type but differing in a mean dopant concentration.

The semiconductor layer 100a forms a planar process surface 101a at a front side of the semiconductor substrate 500a. A normal to the process surface 101a defines a vertical direction and directions orthogonal to the vertical direction are horizontal directions.

A hard mask layer or layer stack may be formed, e.g., deposited on the process surface 101a. Openings may be formed in the hard mask layer or layer stack by lithography to form a trench etch mask 602. Using the trench etch mask, first and second trenches 150z, 160z may be etched into the semiconductor layer 100a.

Figure 11A:
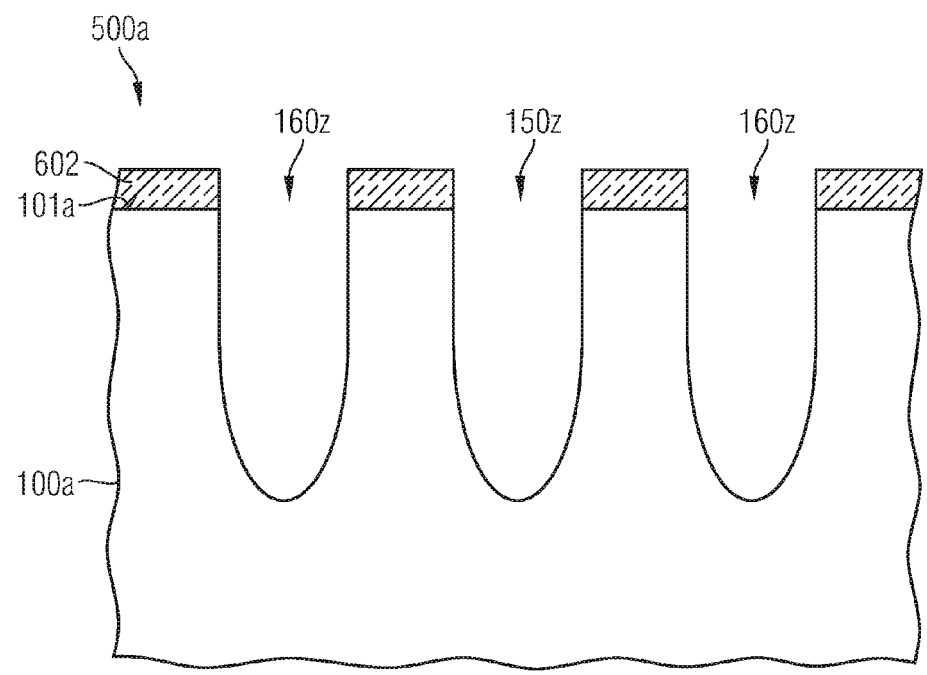
FIG. 11A is a schematic cross-sectional view of a portion of a semiconductor substrate for illustrating a method of manufacturing a semiconductor device according to an embodiment related to gate dielectrics with thick bottom sections, after forming first and second trenches.

FIG. 11A shows the trench etch mask 602 as well as the first and second trenches 150z, 160z extending from the process surface 101a into the semiconductor layer 100a. The trench etch mask 602 may be a single layer mask from silicon oxide or silicon nitride, by way of example, or a multi-layer mask for example a composite mask including a thermally grown silicon oxide layer, a deposited or thermally grown silicon oxynitride or silicon nitride layer and a deposited silicon oxide layer based on TEOS (tetraethyl orthosilicate).

The trench etch mask 602 may be completely removed and a thermal oxidation process may form a thin auxiliary oxide layer lining the first and second trenches 150z, 160z and covering the process surface 101a. The auxiliary oxide layer may be removed, wherein edges of the first and second trenches 150z, 160z are rounded and sidewalls of the first and second trenches 150z, 160z are smoothed. A conformal sacrificial oxide layer 612 may be grown and/or deposited at the front side. A mask liner 622 from a material different from that of the sacrificial oxide layer 612 may be deposited on the sacrificial oxide layer.

Figure 11B:
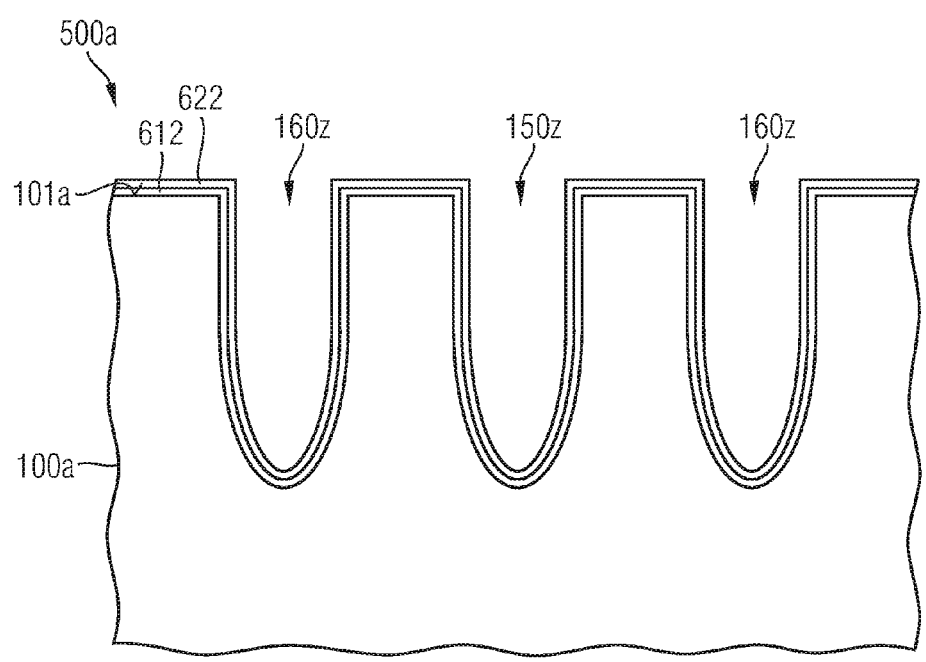
FIG. 11B is a schematic cross-sectional view of the semiconductor substrate portion of FIG. 11A, after depositing an auxiliary mask layer.

FIG. 11B shows the sacrificial oxide layer 612 lining the first and second trenches 150z, 160z as well as the mask liner 622 covering the sacrificial oxide layer 612.

The sacrificial oxide layer 612 may include or consist of one or more semiconductor oxide layers, for example thermally grown silicon oxide and deposited oxide, wherein the deposited oxide may be, for example, deposited silicon oxide formed by using TEOS as precursor material. According to another embodiment, instead of being removed the auxiliary oxide layer may form the sacrificial oxide layer 612 or a portion thereof. The mask liner 622 may be a silicon nitride layer, by way of example.

An auxiliary mask layer may be deposited and pattered by lithography to form a mask liner etch mask with remnant portions covering portions of the mask liner 622 in and around the first trench structures 150z while exposing portions of the mask liner 622 in and around the second trench structures 160z. A dry etch process removes the exposed portions of the mask liner 622 to form a wet etch mask 623 in and around the first trenches 150z. A selective wet etch may then remove exposed portions of the sacrificial oxide layer 612 and, starting from the edges of the wet etch mask 623, may remove portions of the sacrificial oxide layer 612 covered by the wet etch mask 623. Before, after or during etch of the sacrificial oxide layer 612, the mask liner etch mask is removed.

Figure 11C:
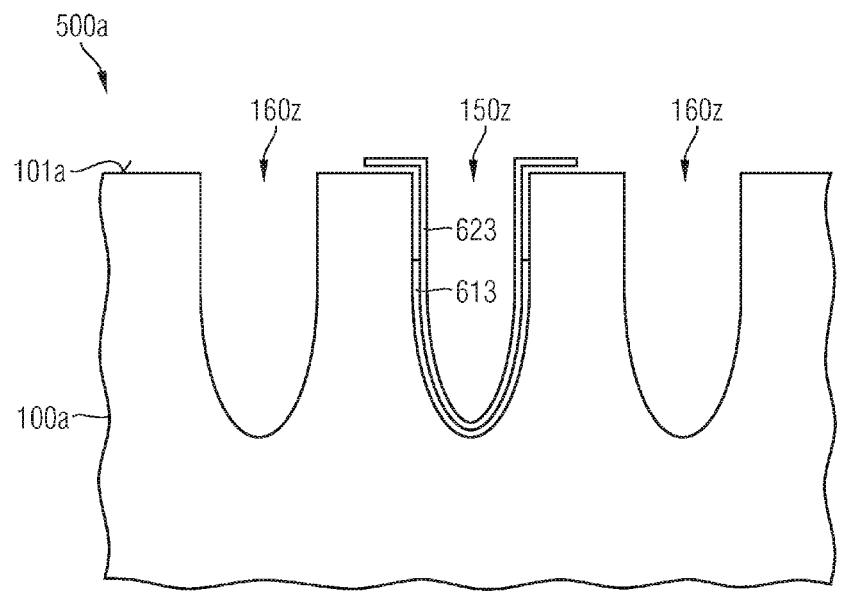
FIG. 11C is a schematic cross-sectional view of the semiconductor substrate portion of FIG. 11B, after recessing an auxiliary oxide layer.

FIG. 11C shows remnant portions 613 of the sacrificial oxide layer 612 after the wet etch. The remnant portions 613 are formed at a distance to edges of the wet etch mask 623. Recesses undercut the wet etch mask 623. The wet etch mask 623 may be removed and a further dielectric liner 632 may be deposited and/or thermally grown on exposed portions of the semiconductor layer 100a.

Figure 11D:
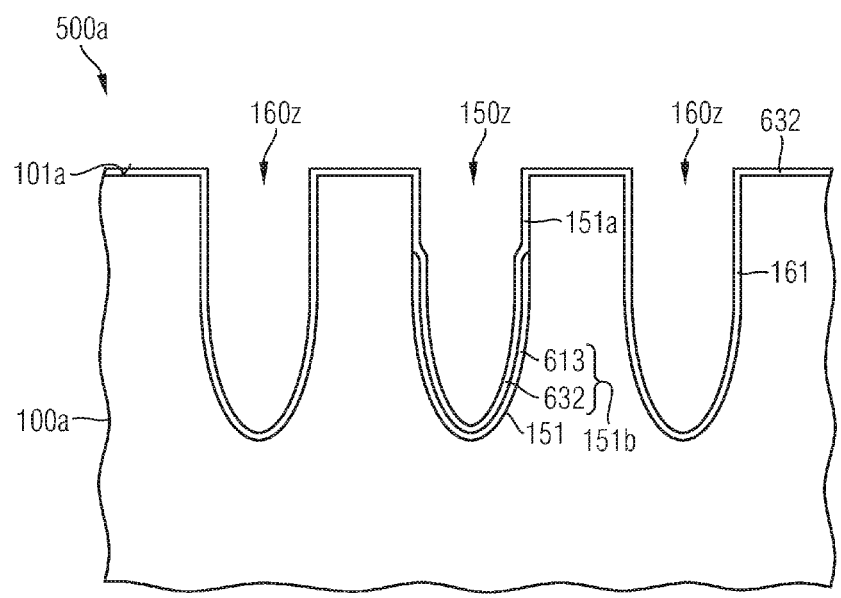
FIG. 11D is a schematic cross-sectional view of the semiconductor substrate portion of FIG. 11C, after forming first and second gate dielectrics.

As illustrated in FIG. 11D portions of the further dielectric liner 632 form second gate dielectrics 161 of uniform thickness in the second trenches 160z. In the first trenches 150z, portions of the further dielectric liner 632 form thin first sections 151a of first gate dielectrics 151 in upper portions of the first trenches 150z and, in combination with the remnant portions 613 of the sacrificial oxide layer 612, second, reinforced sections 151b of the first gate dielectrics 151 in bottom portions of the first trenches 150z.

FIGS. 12A to 12F refer to an embodiment providing beak portions of first gate dielectrics 161 along selected portions of trench sidewalls of first trenches 150z.

A trench etch mask 602 may be formed on a semiconductor layer 100a as described with reference to FIG. 11A, wherein the trench etch mask 602 may be a composite mask including a nitride-containing layer. After forming the first and second trenches 150z, 160z a sublayer of the trench etch mask 602 may be removed. For example, the trench etch mask 620 is an ONO (oxygen-nitride-oxygen) mask including a silicon oxide or oxynitride layer 602a deposited or grown on the semiconductor layer 100a, a silicon nitride layer 602b formed on the silicon oxide or oxynitride layer 602a and a TEOS oxide layer deposited on the silicon nitride layer 602b.

After stripping the TEOS oxide layer, the silicon nitride layer 602b and the silicon oxide or oxynitride layer 602a of the trench etch mask 602 cover mesa sections 170 of the semiconductor layer 100a between the first and second trenches 150z, 160z.

Figure 12A:
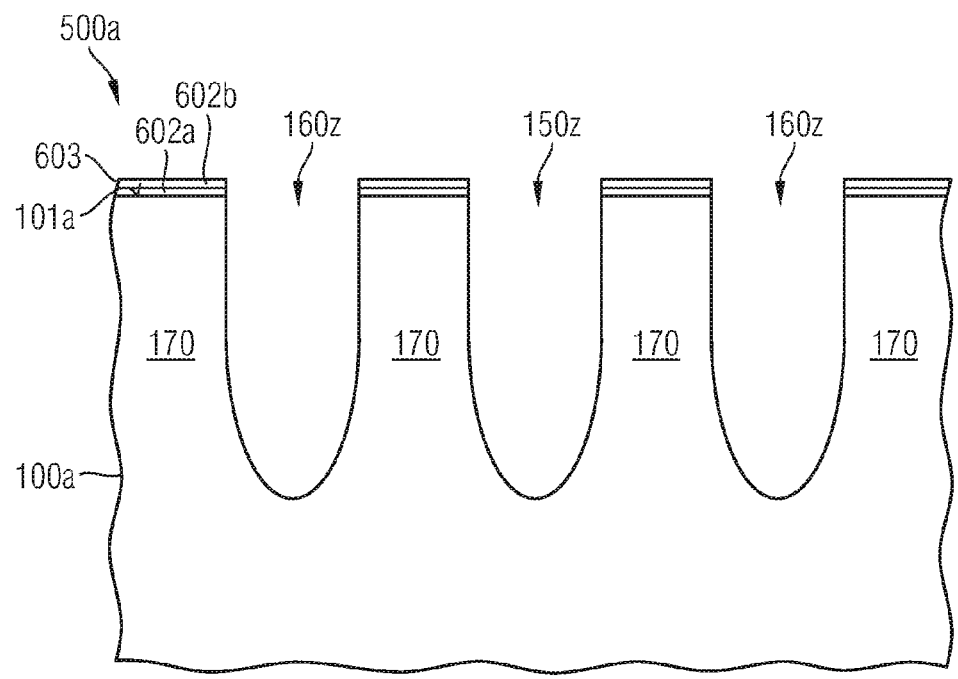
FIG. 12A is a schematic cross-sectional view of a portion of a semiconductor substrate for illustrating a method of manufacturing a semiconductor device according to an embodiment related to the formation of gate dielectrics with beak portions by using a spacer mask, after removing a sublayer of a trench etch mask.

FIG. 12A shows first and second trenches 150z, 160z as well as remnant portions 603 of the trench etch mask 602 above the mesa sections 170. The remnant portions 603 of the trench etch mask 602 may be or may include a silicon nitride layer 602b. Exposed sidewalls of the first and second trenches 150z, 160z are thermally oxidized to form a sacrificial oxide liner 614 lining the first and second trenches 150z, 160z. Formation and removal of the sacrificial oxide liner 614 rounds edges of the first and second trenches 150z, 160z and smoothes the trench sidewalls.

A mask liner 622, for example a silicon nitride layer, is deposited.

Figure 12B:
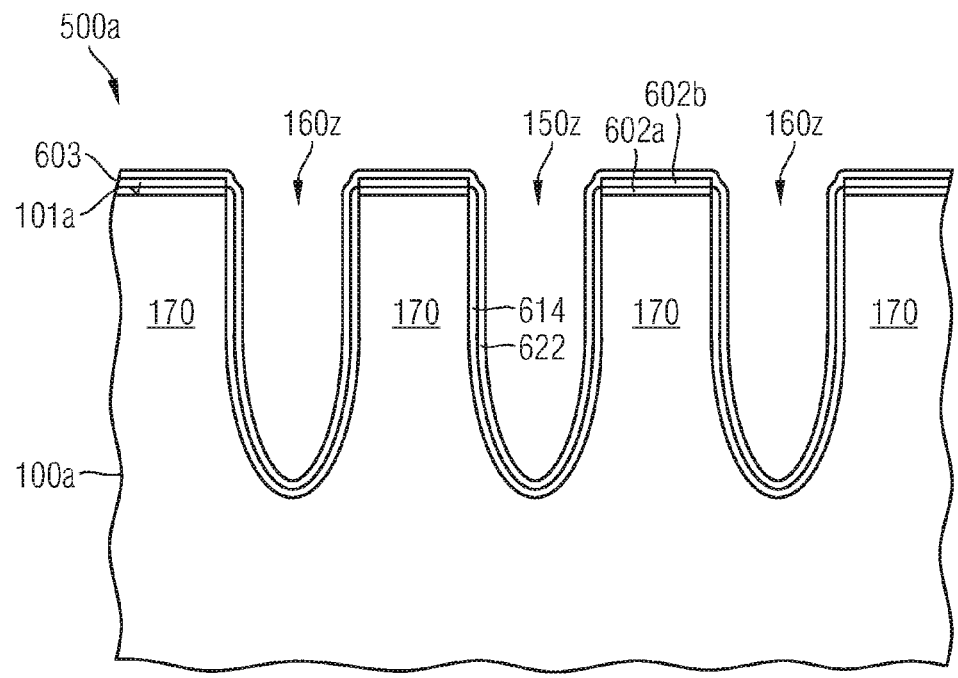
FIG. 12B is a schematic cross-sectional view of the semiconductor substrate portion of FIG. 12A, after forming a spacer mask layer.

Outside the first and second trenches 150z, 160z the mask liner 622 covers the remnant portions 603 of the trench etch mask. In the first and second trenches 150z, 160z the mask liner 622 covers the sacrificial oxide liner 614 on the trench sidewalls as shown in FIG. 12B.

An anisotropic etch process removes horizontal portions of the mask liner 622 above the mesa sections 170 and at the bottom of the first and second trenches 150z, 160z. The remnant portions 603 of the trench etch mask may shield the mesa sections 170 against the etching.

FIG. 12C shows the patterned mask liner 623 forming a spacer mask that exposes remnant portions of the trench etch mask 603 on the mesa sections 170 as well as portions of the sacrificial oxide liner 614 at the bottom of the first and second trenches 150z, 160z. An auxiliary mask layer is deposited and patterned by lithography to form a mask liner etch mask 643 covering or filling the first trenches 150z and exposing the second trenches 160z. An anisotropic dry etch removes portions of the patterned mask liner 623 in the second trenches 160z.

In FIG. 12D the mask liner etch mask 643 fills the first trenches 150z. Remnant portions of the patterned mask liner 623 form a wet etch mask 624 selectively in the first trenches 150z. The mask liner etch mask 643 exposes portions of the sacrificial oxide liner 614 in the second trenches 160z as well as some remnants of the trench etch mask.

Exposed portions of the sacrificial oxide liner 614 may be removed. Then the mask liner etch mask 643 may be removed. A wet etch recesses the sacrificial oxide liner 614 in the first trenches 150z, wherein the recess starts at the outer edges of the wet etch mask 624 at the process surface 101a and at the trench bottoms.

Figure 12E:
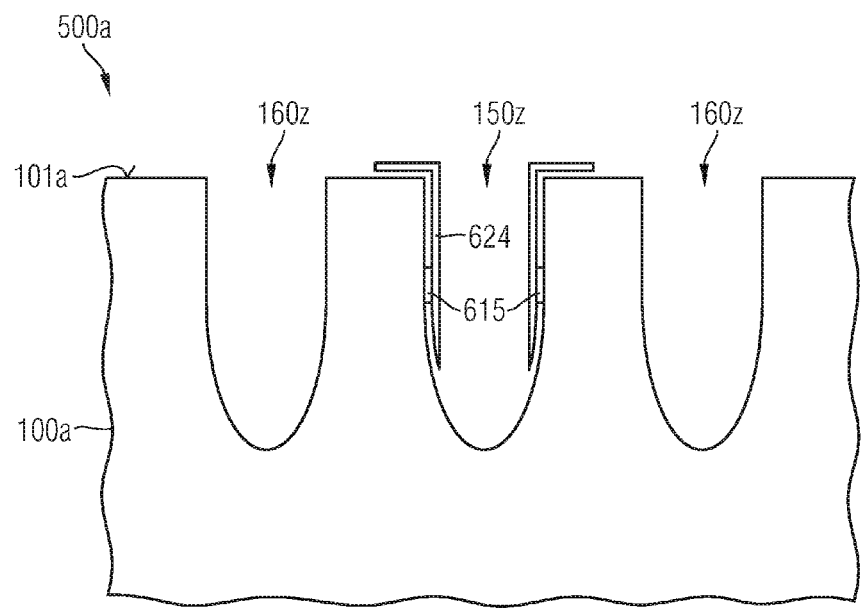
FIG. 12E is a schematic cross-sectional view of the semiconductor substrate portion of FIG. 12D, after a recess of a sacrificial oxide layer.

FIG. 12E shows remnant portions 615 of the sacrificial oxide liner 614 of FIG. 12D in central portions of the sidewalls of the first trenches 150z. Recesses undercut the wet etch mask 624.

Figure 12F:
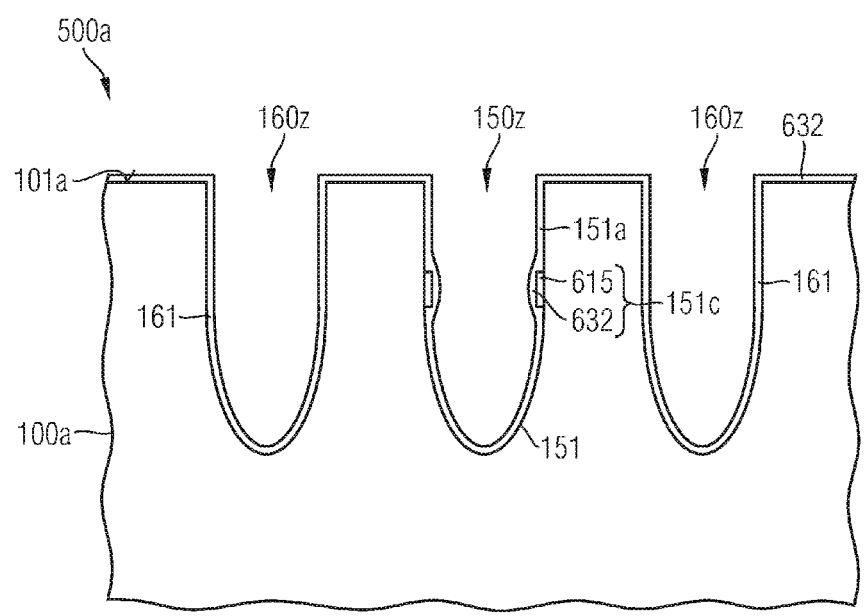
FIG. 12F is a schematic cross-sectional view of the semiconductor substrate portion of FIG. 12E, after forming first and second gate dielectrics.

The wet etch mask 624 may be removed and a further oxidation process or deposition process may form the first and second gate dielectrics 151, 161 as illustrated in FIG. 12F. The remnant portions 615 of the sacrificial oxide liner 614 form at least portions of beak portions 151c of the first gate dielectrics 151.

FIGS. 13A to 13F refer to the oxidation of a polycrystalline silicon spacer structure along sections of sidewalls of first trenches.

First and second trenches 150z, 160z are etched into a semiconductor layer 100a of a semiconductor substrate 500a as described with reference to FIG. 11A. The trench etch uses a trench etch mask consisting of or including a nitride containing layer, e.g., a silicon nitride layer. After forming the first and second trenches 150z, 160z, a sublayer of the trench etch mask, e.g., an oxide containing portion such as a TEOS oxide may be removed as yet illustrated in FIG. 12A.

A sacrificial oxide liner 614 may be thermally grown on the exposed sidewalls of the first and second trenches 150z, 160z and polycrystalline semiconductor material, for example polycrystalline silicon, may be deposited and recessed, e.g., using a plasma etch.

Figure 13A:
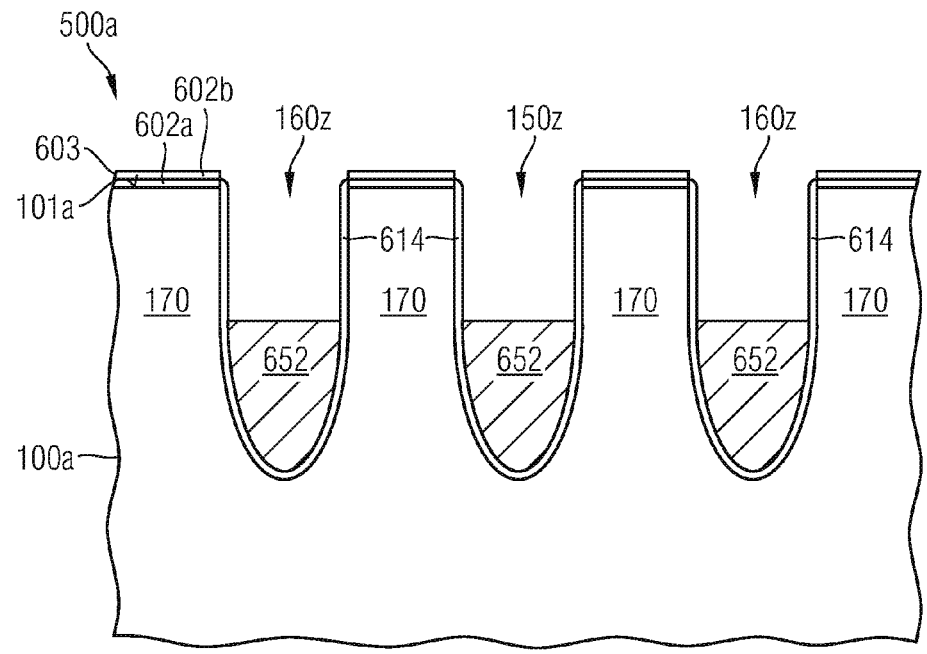
FIG. 13A is a schematic cross-sectional view of a portion of a semiconductor substrate for illustrating a method of manufacturing a semiconductor device according to an embodiment based on spacers of polycrystalline semiconductor material, after recessing polycrystalline semiconductor material in first and second trenches.

FIG. 13A shows the recessed polycrystalline semiconductor material 652 filling lower portions of the first and second trenches 150z, 160z and exposing portions of the sacrificial oxide liner 614 in upper portions of the first and second trenches 150z, 160z between the process surface 101a and an upper edge of the recessed polycrystalline semiconductor material 652.

A mask liner 622, e.g., a silicon nitride layer, may be deposited that covers remnants 603 of the trench etch mask in the vertical direction of mesa sections 170, the exposed portions of the sacrificial oxide liner 614 and the recessed polycrystalline semiconductor material 652. An auxiliary mask material may be deposited and patterned by lithography to form a mask liner etch mask 643.

Figure 13B:
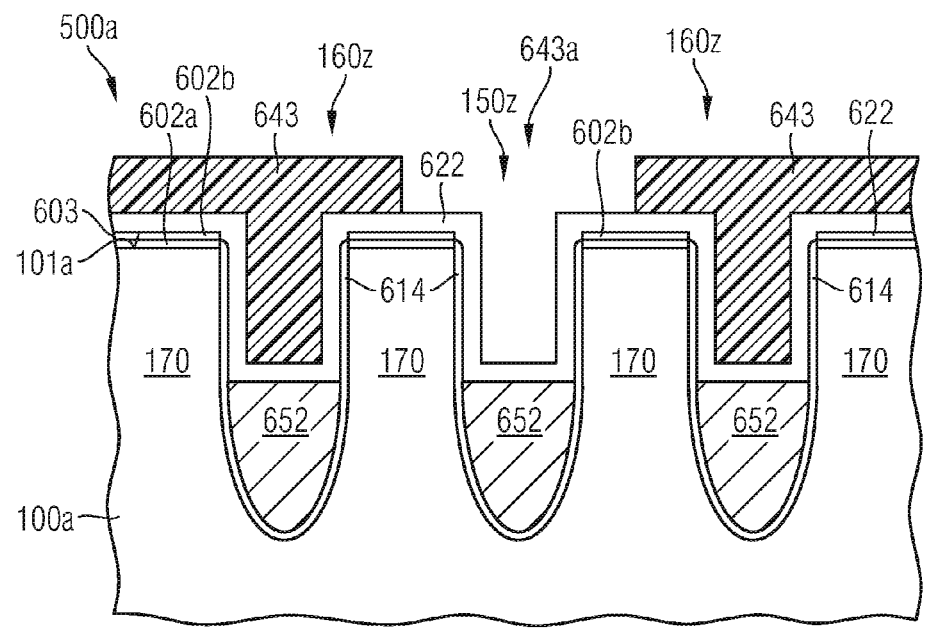
FIG. 13B is a schematic cross-sectional view of the semiconductor substrate portion of FIG. 13A, after forming a mask liner etch mask with openings in the vertical projection of the first trenches.

FIG. 13B shows the mask liner etch mask 643 covering portions of the mask liner 622 in the second trenches 160z and including openings 643a exposing portions of the mask liner 622 in and around the first trenches 150z.

Through the openings 643a an anisotropic etch removes exposed horizontal portions of the mask liner 622 in and around the first trenches 150z.

Figure 13C:
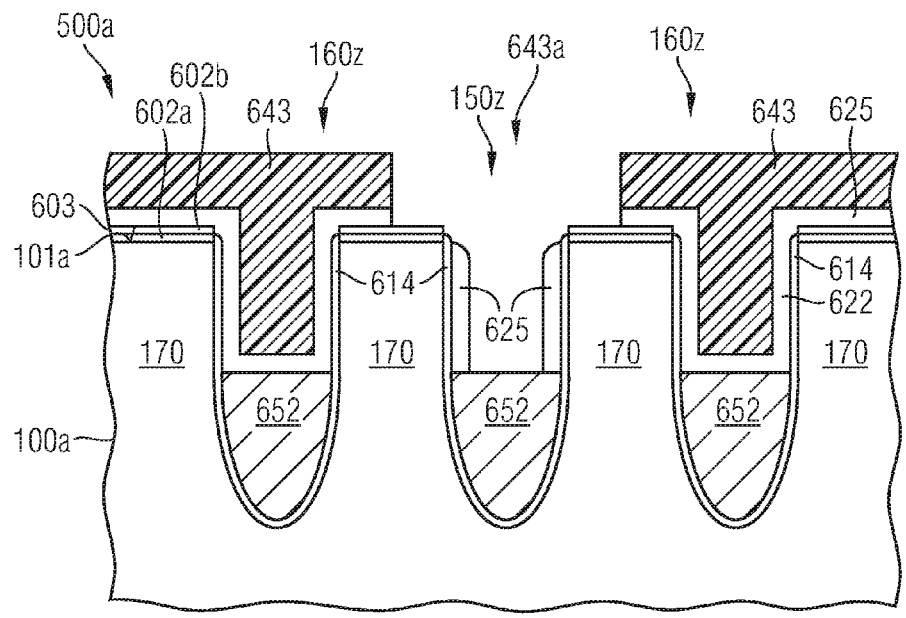
FIG. 13C is a schematic cross-sectional view of the semiconductor substrate portion of FIG. 13B, after forming a spacer mask selectively in upper portions of the first trenches.

FIG. 13C shows remnant portions of the mask liner 622 forming a spacer mask 625 in the upper portions of the first trenches 150z. The spacer mask 625 exposes the recessed polycrystalline semiconductor material 652 in the first trenches 150z.

An anisotropic etch process, e.g., an RIE (reactive ion etch) process removes portions of the recessed polycrystalline semiconductor material 652 in the first trenches 150z and stops on the sacrificial oxide liner 614.

Figure 13D:
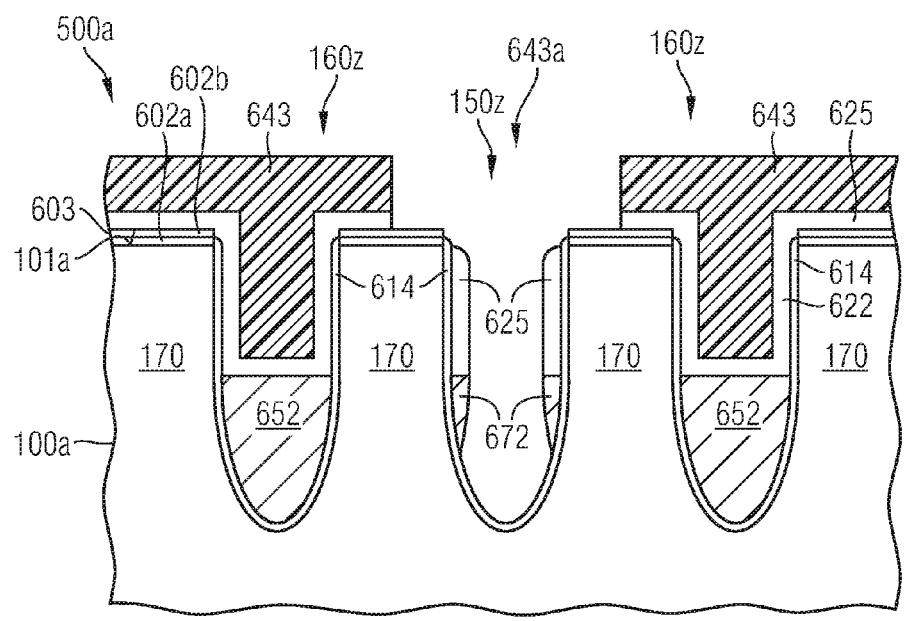
FIG. 13D is a schematic cross-sectional view of the semiconductor substrate portion of FIG. 13C, after forming polycrystalline spacers in the first trenches.

As illustrated in FIG. 13D remnants of the recessed polycrystalline semiconductor material 652 in the first trenches 150z form polycrystalline silicon spacers 672 in the vertical projection of the spacer mask 625.

The anisotropic etch process may also remove the mask liner etch mask 643. Alternatively, the mask liner etch mask 643 is removed in a further etch process. A further thermal oxidation may be performed to convert at least portions of the polycrystalline silicon spacers 672 in oxide spacers 673.

Figure 13E:
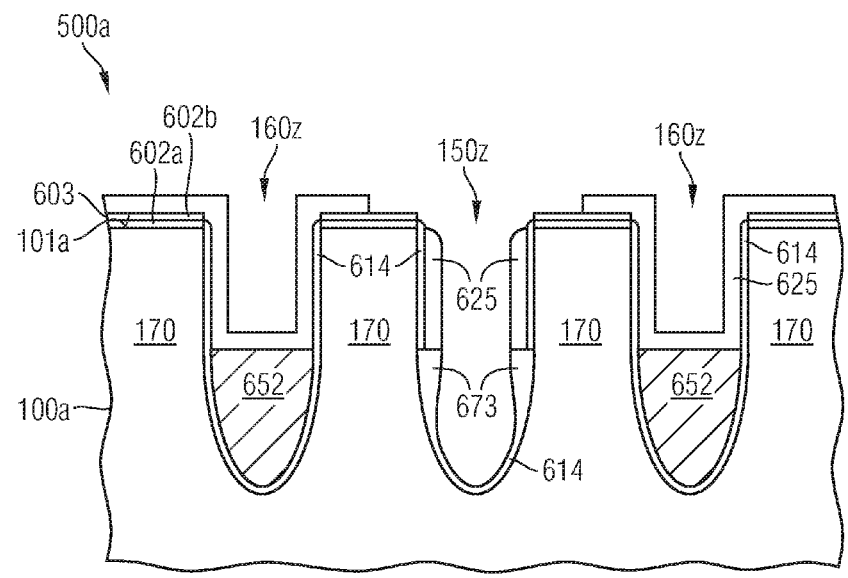
FIG. 13E is a schematic cross-sectional view of the semiconductor substrate portion of FIG. 13D, after oxidizing the polycrystalline spacers.

FIG. 13E shows the oxide spacers 673 formed along sections of the sidewalls of the first trenches 150z. The thermal oxidation may enhance a portion of the sacrificial oxide liner 614 along the bottom of the first trenches 150z.

The mask liner spacer mask 625, remnants of the recessed polycrystalline semiconductor material 652 in the second trenches 160z and remnants 603 of the trench etch mask may be removed. The sacrificial oxide liner 614 may be removed and a further oxidation process or deposition process may form a further dielectric layer 632 that forms the first and second gate dielectrics 151, 161, wherein the oxide spacers 673 form at least portions of beak portions 151c of the first gate dielectrics 151.

Figure 13F:
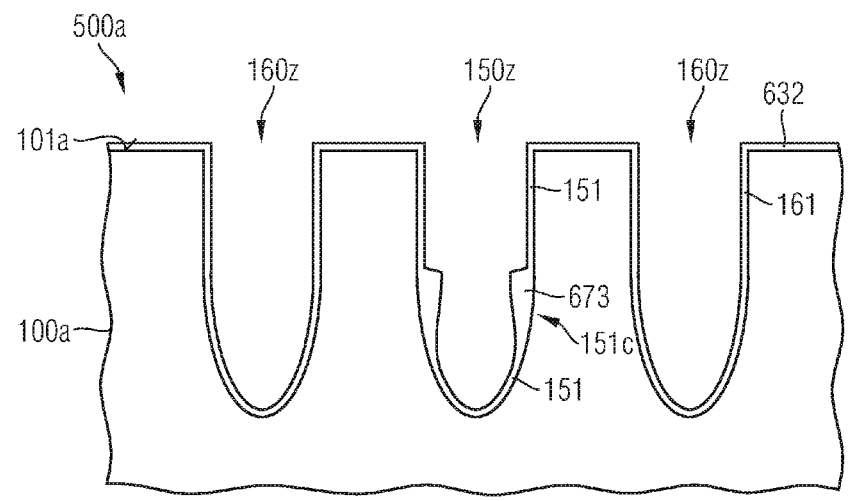
FIG. 13F is a schematic cross-sectional view of the semiconductor substrate portion of FIG. 13E, after forming first and second gate dielectrics.

FIG. 13F shows the first trenches 150z with the first gate dielectrics 151 and the second trenches 160z with the second gate dielectrics 161. The first gate dielectrics 151 include beak portions 151c along sections of the vertical sidewalls and may include an enhanced portion at the bottom of the first trenches 150z.

FIGS. 14A to 14D refer to the formation of gate dielectrics with beak portions using a deep damage implant process.

Figure 14A:
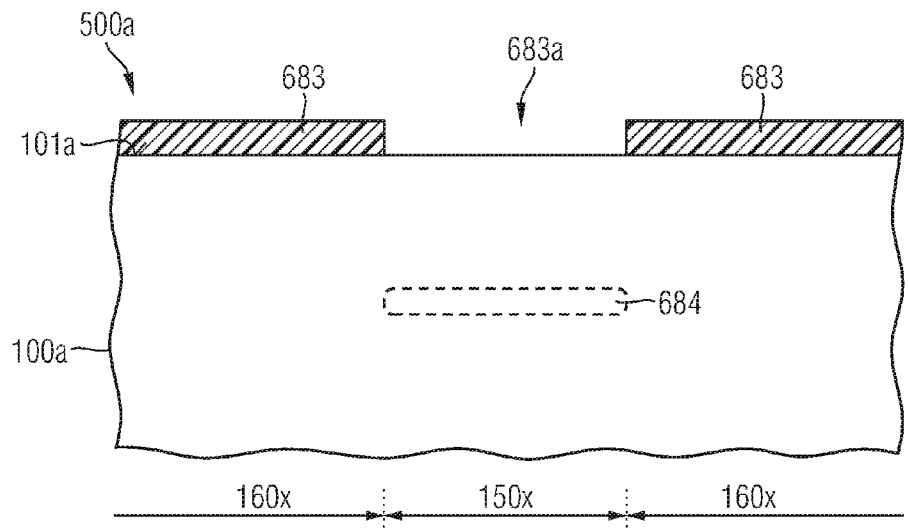
FIG. 14A is a schematic cross-sectional view of a portion of a semiconductor substrate for illustrating a method of manufacturing a semiconductor device according to another embodiment, after a damage implant.

FIG. 14A shows an implant mask 683 formed by depositing an implant mask layer on a semiconductor layer 100a as described with reference to FIG. 11A and by patterning the implant mask layer by lithography. The implant mask 683 exposes first regions 150x assigned to the formation of first trenches and shields second regions 160x assigned to the formation of second trenches. A damage implant is performed through openings 683a in the implant mask 683. The damage implant may use argon (Ar), hydrogen (H) or helium (He) ions, by way of example, and forms buried damage zones 684 in a distance to the process surface 101a. The damage implant may overlap with an implant for formation of barrier zones. Alternatively, e.g., fluorine (F) or a further element to promote the oxidization rate may be implanted.

The implant mask 683 may be removed. A trench etch mask layer or layer stack may be deposited and patterned by lithography to form a trench mask 602. Using the trench etch mask 602 first and second trenches 150z, 160z are etched into the semiconductor layer 100a.

Figure 14B:
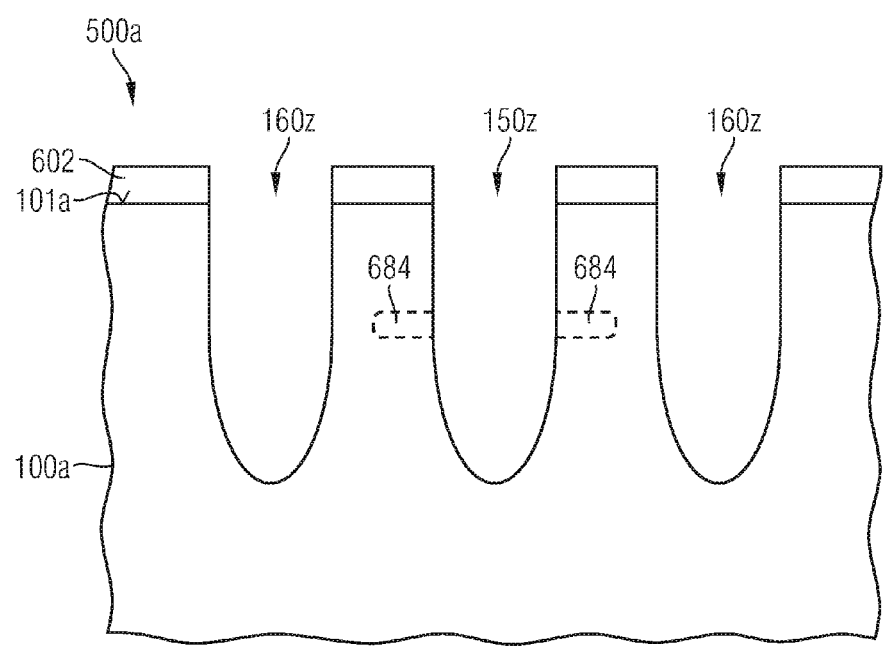
FIG. 14B is a schematic cross-sectional view of the semiconductor substrate portion of FIG. 14A, after forming first and second trenches.

FIG. 14B shows the first and second trenches 150z, 160z extending from the process surface 101a into the semiconductor layer 100a. The first trenches 150z cut through the damage zones 684 in the semiconductor layer 100a.

The trench etch mask 602 may be removed and a thermal oxidation process forms either gate dielectrics or a sacrificial oxide layer 612. Along sidewall portions formed by the damage zones 684 the oxidation rate is higher than along sidewall portions formed by undamaged semiconductor material.

FIG. 14C shows a sacrificial oxide layer 612 lining the first and second trenches 150z, 160z as well as top surfaces of mesa sections 170 between the first and second trenches 150z, 160z. Due to the higher oxidation rate in damaged semiconductor material, the sacrificial oxide layer 612 includes beak portions 685 along sidewall sections of the first trenches 150z defined by position and vertical extension of the damage zones 684 of FIG. 14A. An isotropic etch process may remove thin portions of the sacrificial oxide layer 612 outside the beak portions 685 to smoothen the trench sidewalls. A further oxidation process or deposition process may form a further dielectric layer 632 that forms the first and second gate dielectrics 151, 161, wherein the beak portions 685 form at least portions of beak portions 151c of the first gate dielectrics 151.

FIG. 14D shows the first trenches 150z with the first gate dielectrics 151 and the second trenches 160z with the second gate dielectrics 161. The first gate dielectrics 151 include beak portions 151c along sections of the vertical sidewalls.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a transistor cell comprising a body zone forming a first pn junction with a drift structure, the transistor cell configured to form, in the body zone, an inversion channel forming part of a connection between the drift structure and a first load electrode when a first control signal exceeds a first threshold;
a delay unit configured to generate a second control signal which trailing edge is delayed with respect to a trailing edge of the first control signal; and
an enhancement cell configured to form an inversion layer in the drift structure when the second control signal falls below a second threshold lower than the first threshold, wherein the inversion layer is effective as minority charge carrier emitter.

2. The semiconductor device of claim 1, wherein
the enhancement cell comprises a charge carrier transfer zone forming a further first pn junction with the drift structure.

3. The semiconductor device of claim 2, wherein
the charge carrier transfer zone directly adjoins the body zone.

4. The semiconductor device of claim 2, wherein
the charge carrier transfer zone is separated from the body zone.

5. The semiconductor device of claim 2, wherein
the enhancement cell is configured to form, in the charge carrier transfer zone, a secondary inversion layer electrically disconnected from the first load electrode when the second control signal exceeds the first threshold.

6. The semiconductor device of claim 5, wherein
the enhancement cell comprises a heavily doped second interruption zone forming a unipolar homojunction with the charge carrier transfer zone and interrupting the secondary inversion layer.

7. The semiconductor device of claim 5, wherein
the enhancement cell is devoid of any doped zone that both forms a pn junction with the charge carrier transfer zone and that is electrically connected with the first load electrode.

8. The semiconductor device of claim 1, wherein
the transistor cell comprises a first gate structure to which the first control signal is applied, the transistor cell is configured to form a further inversion layer in the drift structure when the first control signal falls below the second threshold, and at least a portion of the further inversion layer is disconnected from the body zone.

9. The semiconductor device of claim 8, wherein
the transistor cell comprises a heavily doped first interruption zone along the first gate structure, the first interruption zone forming a unipolar homojunction with the drift structure and disconnecting at least a portion of the further inversion layer from the body zone.

10. The semiconductor device of claim 8, wherein
the first gate structure comprises a first gate electrode and a first gate dielectric separating the first gate electrode from the body zone and the drift structure, the first gate dielectric comprising a beak portion with increased width, the beak portion disconnecting at least a portion of the further inversion layer from the body zone at a low level of the first control signal.

11. The semiconductor device of claim 10, wherein
the beak portion extends outwardly from the first gate structure.

12. The semiconductor device of claim 1, wherein
the transistor cell comprises a first gate structure to which the first control signal is applied, the first gate structure comprises a first gate electrode and a first gate dielectric, a first section of the first gate dielectric separating the first gate electrode from the body zone and a second section of the first gate dielectric separating the first gate electrode from the drift structure, and the second section is thicker than the first section and configured to suppress formation of an inversion layer along the first gate structure in the drift structure at a low level of the first control signal.

13. The semiconductor device of claim 1, wherein
the transistor cell comprises a first gate structure to which the first control signal is applied, the first gate structure comprises a first gate electrode and a first gate dielectric separating the first gate electrode from the body zone and the drift structure, the enhancement cell comprises a second gate structure to which the second control signal is applied, and the first gate structure overlaps to a lower degree with the drift structure than the second gate structure.

14. The semiconductor device of claim 1, wherein
the inversion layer of the enhancement cell directly adjoins the body zone of the transistor cell when the second control signal falls below the second threshold.

15. The semiconductor device of claim 14, wherein
the transistor cell comprises a first gate structure to which the first control signal is applied, the first gate structure comprises a first gate electrode and a first gate dielectric separating the first gate electrode from the body zone, the enhancement cell comprises a second gate structure to which the second control signal is applied, the second gate structure comprises a second gate electrode and a second gate dielectric separating the second gate electrode from the drift structure, and an insulator layer sandwiched between the first gate structure and the second gate structure.

16. The semiconductor device of any of claim 1, wherein
a plurality of transistor cells and enhancement cells forms a transistor cell array and a population density of at least one of the transistor cells and enhancement cells varies with decreasing distance to an edge of the transistor cell array.

17. The semiconductor device of claim 16, further comprising
idle cells formed in the transistor cell array.

18. The semiconductor device of claim 1, wherein
the drift structure comprises a weakly doped drift zone and a heavily doped barrier zone sandwiched between the drift zone and the body zone.

19. The semiconductor device of claim 1, wherein
the delay unit comprises a first path connected to a gate node and a second path connected to the gate node, the first path outputting the first control signal and the second path outputting the second control signal in response to a signal applied to the gate node, respectively.

20. The semiconductor device of claim 19, wherein
the first path comprises a first internal resistance and the second path comprises a second internal resistance greater than the first internal resistance.

21. The semiconductor device of claim 20, wherein
the second path comprises a rectifying element in parallel to the second internal resistance, the rectifying element bypassing the second internal resistance for leading signal edges.

22. A power module, comprising:
a half-bridge circuit comprising two switching elements, wherein at least one of the switching elements comprises
a transistor cell comprising a body zone forming a first pn junction with a drift structure and configured to form, in the body zone, an inversion channel forming part of a connection between the drift structure and a first load electrode when a first control signal exceeds a first threshold;
a delay unit configured to generate a second control signal which trailing edge is delayed with respect to a trailing edge of the first control signal; and
an enhancement cell configured to form an inversion layer in the drift structure when the second control signal falls below a second threshold lower than the first threshold, wherein the inversion layer is effective as minority charge carrier emitter.

* * * * *